United States Patent [19]
Wang et al.

[11] Patent Number: 5,519,177
[45] Date of Patent: May 21, 1996

[54] ADHESIVES, ADHESIVE LAYERS FOR ELECTROLESS PLATING AND PRINTED CIRCUIT BOARDS

[75] Inventors: Dong D. Wang; Motoo Asai, both of Gifu, Japan

[73] Assignee: IBIDEN Co., Ltd., Gifu, Japan

[21] Appl. No.: 243,172

[22] Filed: May 16, 1994

[30] Foreign Application Priority Data

May 19, 1993 [JP] Japan .................................. 5-116903

[51] Int. Cl.⁶ ........................................................ H05K 1/02
[52] U.S. Cl. ............................ 174/259; 174/258; 174/256
[58] Field of Search .................................... 174/256, 257, 174/258, 259

[56] References Cited

U.S. PATENT DOCUMENTS

| | | | |
|---|---|---|---|
| 3,763,088 | 10/1973 | Izawa et al. | 260/41.5 A |
| 4,120,913 | 10/1978 | Petrie | 268/830 |
| 4,752,499 | 6/1988 | Enomoto . | |
| 4,783,506 | 11/1988 | Gawin | 524/109 |
| 4,863,787 | 9/1989 | Gawin | 428/240 |
| 4,954,195 | 9/1990 | Turpin | 156/242 |
| 4,972,031 | 11/1990 | Choate et al. | 525/535 |
| 4,999,238 | 3/1991 | Gawin | 428/283 |
| 5,002,821 | 3/1991 | Browne et al. | 428/283 |
| 5,008,318 | 4/1991 | Ishii et al. | 524/284 |
| 5,021,472 | 6/1991 | Enomoto . | |
| 5,055,321 | 10/1991 | Enomoto et al. . | |
| 5,077,347 | 12/1991 | Yabuta et al. | 524/504 |
| 5,106,906 | 4/1992 | Meier et al. | 525/51 |
| 5,106,918 | 4/1992 | Karasz et al. | 525/233 |
| 5,231,150 | 7/1993 | McGrail et al. | 525/503 |
| 5,276,106 | 1/1994 | Portelli et al. | 525/423 |
| 5,278,224 | 1/1994 | Olesen et al. | 524/538 |

FOREIGN PATENT DOCUMENTS

| | | |
|---|---|---|
| 0252725 | 1/1988 | European Pat. Off. . |
| 0311349 | 4/1989 | European Pat. Off. . |
| 0365168 | 4/1990 | European Pat. Off. . |
| 0361247 | 4/1990 | European Pat. Off. . |
| 0422647 | 4/1991 | European Pat. Off. . |
| 1301775 | 12/1989 | Japan . |
| 2164653 | 3/1986 | United Kingdom . |

OTHER PUBLICATIONS

Chemical Patent Index, Documentation Abstracts Journal, Week 9228, Sep. 9, 1992, Derwent Publications, Ltd.

European Search Report And Annex To The European Search Report.

Database WPI, Derwent Publications, Ltd., London, GB; AN 85–033554 (06).

English language abstract of Japanese Laid–Open Patent No. 1–301775.

Yamanaka et al., Polymer, 1989, vol. 30, Apr., pp. 662–667, "Structure Development in Epoxy Resin Modified with Poly(ether sulphone)".

Youqing et al., 34th International SAMPE Symposium, May 8–11, 1989 pp. 875–883, "Study on the Epoxy Resin System Modified Using Polyethersulphone".

Bucknall et al., Polymer Engineering and Science, Mid–Jan., 1986, vol. 26, No. 1, "Phase Separation in Crosslinked Resins Containing Polymeric Modifiers".

Primary Examiner—Laura Thomas
Attorney, Agent, or Firm—Greenblum & Bernstein

[57] ABSTRACT

An adhesive usable for electroless plating in the formation of printed circuit boards is formed by dispersing a cured heat-resistant resin powder soluble in an acid or an oxidizing agent into an uncured heat-resistant resin matrix hardly soluble in an acid or an oxidizing agent after the curing treatment, in which the heat-resistant resin matrix is a mixture of a thermoplastic resin and an uncured thermosetting resin or an uncured photosensitive resin.

68 Claims, 10 Drawing Sheets

FIG_1a
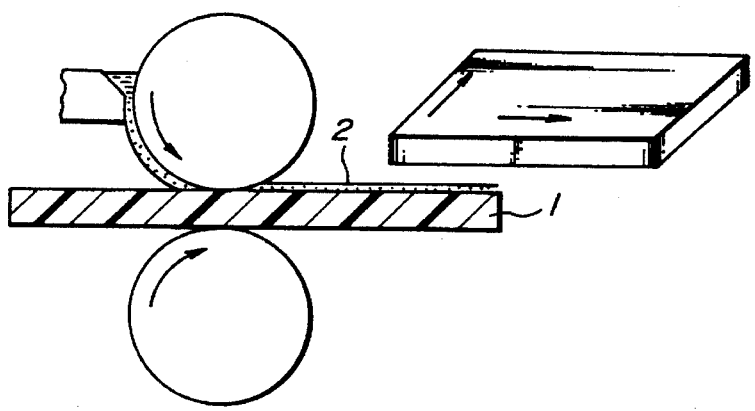
FIG_1b
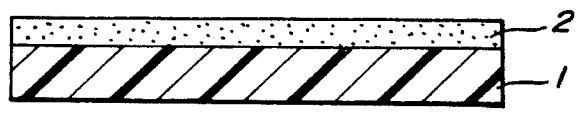
FIG_1c
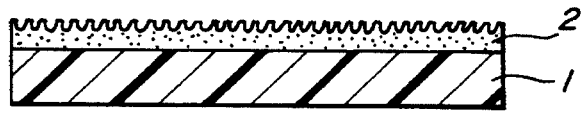
FIG_1d
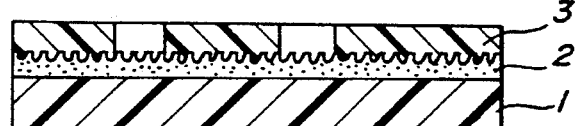
FIG_1e
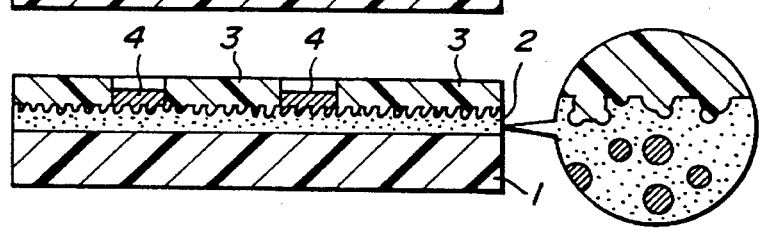
FIG_1f 0.1μm 1μm

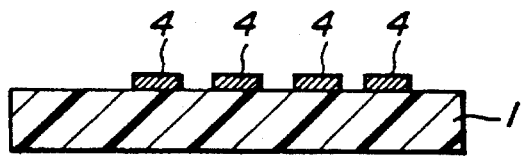
FIG._5a
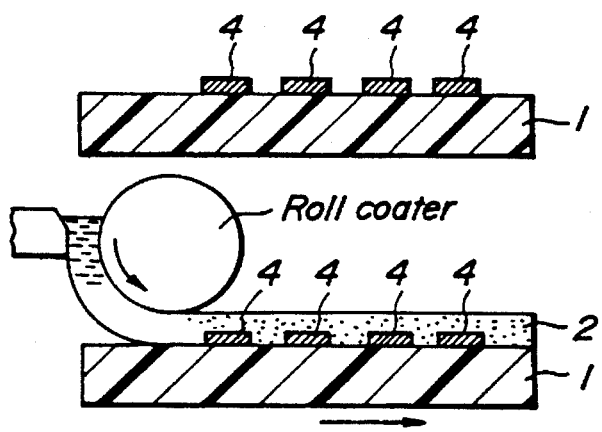
FIG._5b
FIG._5c
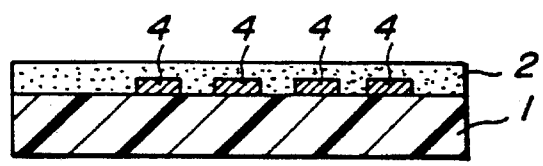
FIG._5d
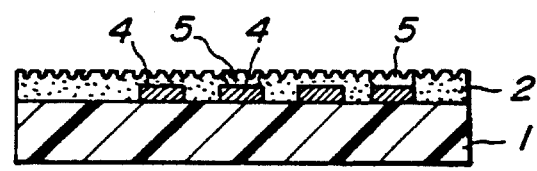
FIG._5e
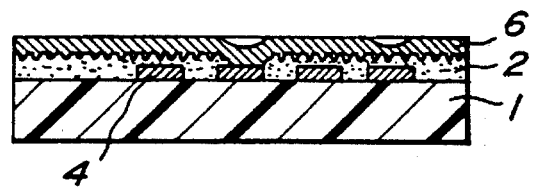
FIG._5f
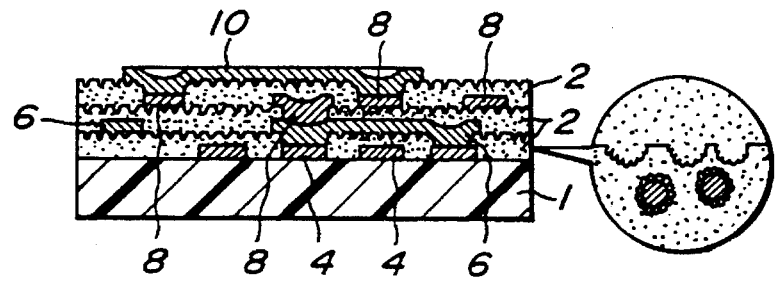

FIG_8
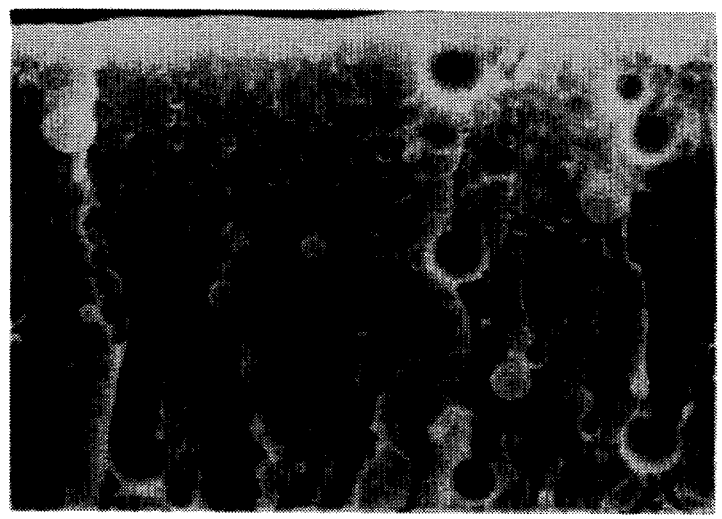
10 μm
FIG_9
10 μm

FIG_11

ADHESIVES, ADHESIVE LAYERS FOR ELECTROLESS PLATING AND PRINTED CIRCUIT BOARDS

BACKGROUND OF THE INVENTION

1. Field of the Invention

This invention relates to an adhesive, an adhesive layer for electroless plating and a printed circuit board, and more particularly to an adhesive technique capable of stably providing a printed circuit board having an excellent peel strength even in wiring with higher density and pattern accuracy.

2. Description of the Related Art

Recently, miniaturization and high-speed performance of electronic equipment has been effected with the advance of electronic industry, and consequently it is demanded to have high densification and reliability through fine pattern against printed circuit board and printed wiring substrate mounting LSI.

Lately, an additive process in which an adhesive is applied onto a surface of a substrate to form an adhesive layer, and the surface of the adhesive layer is roughened and then subjected to an electroless plating to form a conductor is noticed as a method of forming the conductor onto the printed wiring substrate.

According to this method, the conductor is formed by electroless plating after the formation of the resist, so that it has a merit that conductor wiring having high density and pattern accuracy can be produced with a low cost as compared with an etched foil process conducting the formation of pattern through etching (which is known as a subtractive process).

In the additive process, there have hitherto been known a method in which fine unevenness is formed on the conductor-forming surface side of the adhesive layer through a chemical etching as a means for improving the adhesion property between conductor and adhesive layer (hereinafter referred to as peel strength). According to this method, the unevenness of the adhesive layer surface is filled with a plating metal such as a plating copper or the like, whereby the peel strength can be improved through an anchor effect based on the unevenness. Such an improvement of the peel strength through the anchor effect is generally carried out by enlarging the braking surface or by increasing the strength of the conductor metal or the heat-resistant resin matrix constituting the adhesive.

In recent additive type printed circuit boards requiring the formation of wiring with high density and pattern accuracy, it is required to make small anchors formed by surface toughening of the adhesive layer in order to precisely form the fine pattern of the resist. Therefore, this conventional technique causes a problem that as the anchor becomes small, the breaking area is also small and hence the peel strength considerably lowers.

In order to solve this problem, there is a method of increasing the strength of the conductor metal or the heat-resistant resin matrix constituting the adhesive. However, according to the inventors' experiment, it has been confirmed that the peel of the electroless plated layer forming the conductor is caused by the breakage of the heat-resistant resin matrix in the conventional printed circuit board using copper as a conductor metal and a thermosetting resin or photosensitive resin as a heat-resistant resin matrix constituting the adhesive. That is, it is noticed that the cause of decreasing the peel strength lies in the poor strength of the heat-resistant resin matrix constituting the adhesive.

SUMMARY OF THE INVENTION

It is, therefore, an object of the invention to solve the aforementioned problems of the conventional techniques and to increase a toughness of a heat-resistant resin matrix constituting the adhesive without degrading heat resistance, electrical insulation property and chemical stability.

It is another object of the invention to provide an adhesive layer for electroless plating having an excellent adhesion property to the electroless plated layer.

It is the another object of the invention to establish a technique capable of stably providing a printed circuit board having an excellent peel strength even in wiring with higher density and pattern accuracy.

The inventors have made various studies with respect to the improvement in the strength of the heat-resistant resin matrix constituting the adhesive in order to achieve the object and found that printed circuit boards having an excellent adhesion strength to conductor metal even if the depth of anchor formed by roughening treatment is small can be provided by using a mixed resin of a thermoplastic resin and an uncured thermosetting resin including a resin substituted at a part of functional group with a photosensitive group or an uncured photosensitive resin as a heat-resistant resin matrix constituting the adhesive, and further using a resin composite obtained by the curing of the mixed resin as an adhesive layer, and as a result the invention has been accomplished.

According to a first aspect of the invention, there is the provision of an adhesive formed by dispersing a cured heat-resistant resin powder soluble in an acid or an oxidizing agent into an uncured heat-resistant resin matrix hardly soluble in an acid or an oxidizing agent after the curing treatment, in which the heat-resistant resin matrix is a compatibility-adjusted mixture of a thermoplastic resin and an uncured thermosetting resin including a resin wherein a part of functional group thereof is substituted with a photosensitive group (hereinafter referred to as an uncured thermosetting resin simply) or an uncured photosensitive resin. In a preferred embodiment, the resin mixture is at a compatible state or an incompatible state and is dissolved in a solvent.

When the resin mixture is at the compatible state, quasi-homogeneous compatible structure, co-continuous phase structure or spherical domain structure as mentioned later can be obtained by adjusting phase-separation rate and curing rate in the curing of the resin mixture.

When the resin mixture is at the incompatible state, spherical domain structure can be obtained by curing the mixture as it is.

According to a second aspect of the invention, there is the provision of an adhesive layer for electroless plating formed by applying onto a substrate an adhesive formed by dispersing a cured heat-resistant resin powder soluble in an acid or an oxidizing agent into a cured heat-resistant resin matrix hardly soluble in an acid or an oxidizing agent, in which the heat-resistant resin matrix is a resin composite of a thermoplastic resin and a thermosetting resin including a resin wherein a part of functional group thereof is substituted with a photosensitive group (hereinafter referred to as a thermosetting resin simply) or a photosensitive resin. In a preferred embodiment, the resin composite forms a quasi-homogeneous compatible structure, co-continuous phase structure or spherical domain structure.

As the substrate, use may be made of various substrates such as printed circuit board provided with conductor circuit, fiber-like, rod-like and spherical-shaped substrates.

According to a third aspect of the invention, there is the provision of a printed circuit board comprising a substrate, an adhesive layer formed on the substrate by dispersing a cured heat-resistant resin powder soluble in an acid or an oxidizing agent into a cured heat-resistant resin matrix hardly soluble in an acid or an oxidizing agent, and a conductor circuit formed on a roughened surface of the adhesive layer, in which the heat-resistant resin matrix is a resin composite of a thermoplastic resin and a thermosetting resin or a photosensitive resin. In a preferred embodiment, the resin composite forms a quasi-homogeneous compatible structure, co-continuous phase structure or spherical domain structure.

BRIEF DESCRIPTION OF THE DRAWINGS

The invention will be described with reference to the accompanying drawings, wherein:

FIGS. 1a–1f are a flow sheet illustrating the production steps of an embodiment of the printed circuit board according to the invention in FIGS. 1a–1f;

FIGS. 5a–5f are a flow sheet illustrating the production steps of another embodiment of the printed circuit board according to the invention in FIGS. 5a–5f;

FIG. 8 is an SEM photograph showing a crystal structure at section of the adhesive layer after the drying and before the curing;.

FIG. 9 is an SEM photograph showing a crystal structure at section of the adhesive layer after the curing;

DESCRIPTION OF THE PREFERRED EMBODIMENTS

Figure 2:
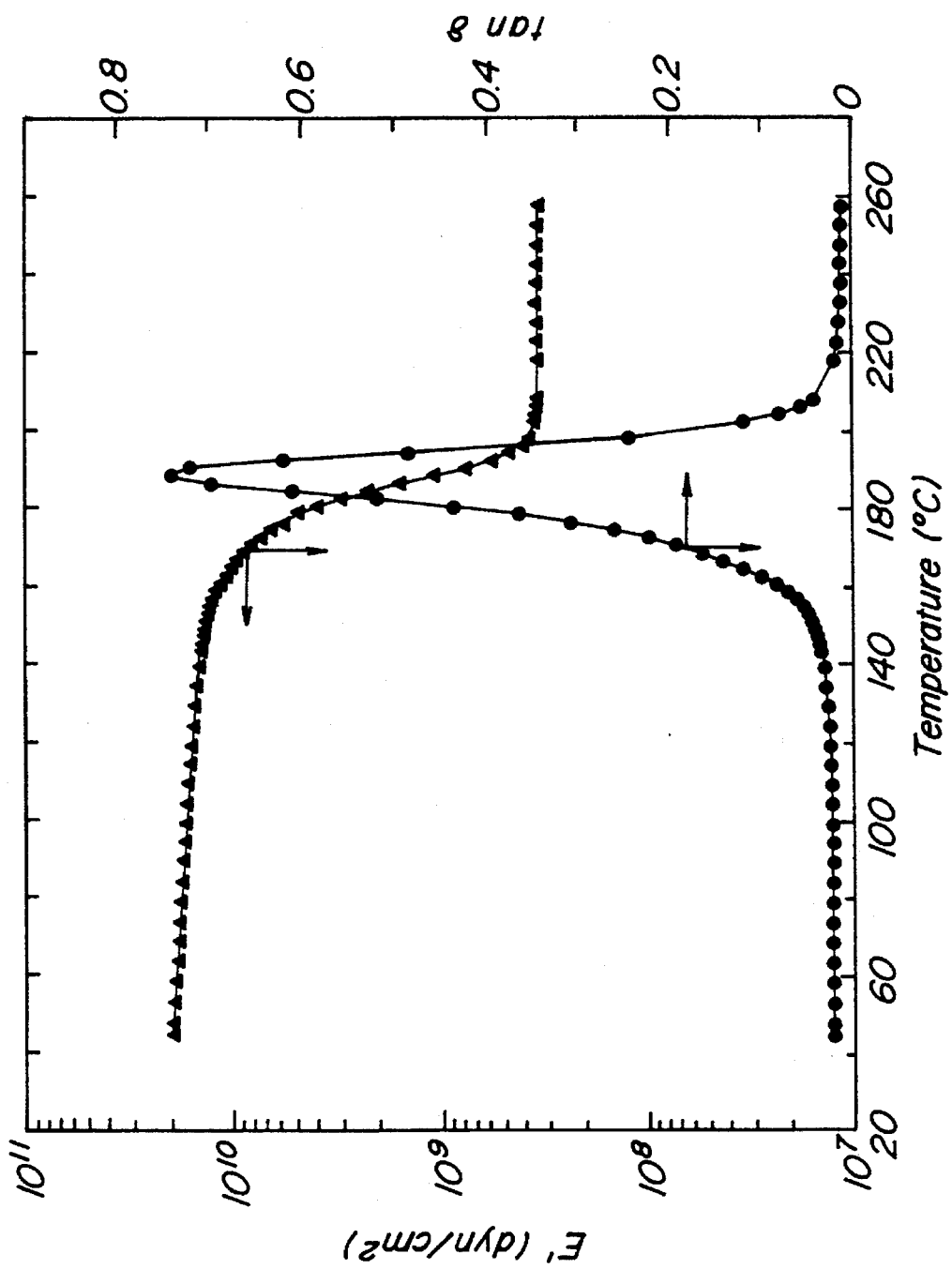
FIG. 2 is a graph showing results of dynamic viscoelasticity measured on the resin composite having a quasi-homogeneous compatible structure according to the invention.

An essential feature in the adhesive according to the invention lies in a point that the adhesive matrix is a mixture of the uncured thermoplastic resin and the uncured thermosetting resin or photosensitive resin.

Thus, the resin matrix of the adhesive can be toughened without lowering the heat resistance, electrical resistance and chemical stability.

In the adhesive according to the invention, it is desirable that the uncured thermoplastic resin is homogeneously mixed with the uncured thermosetting resin or photosensitive resin at a compatible state.

The reason why the mixed resin of the above compatible state is used as the heat-resistant resin matrix for the adhesive is due to the fact that the resin structure of the resin composite consisting of the cured thermoplastic resin and the thermosetting resin or photosensitive resin can easily be controlled in accordance with the curing conditions.

As the method of homogeneously mixing and dispersing the uncured thermosetting resin or photosensitive resin with the uncured thermoplastic resin at a compatible state, there are a method of dissolving these resins into a solvent, a method in which the thermoplastic resin is fused by heating and then mixed with the thermosetting resin or photosensitive resin, and the like. Among them, the method of dissolving the resins in the solvent is preferably used because the operability is good and the compatible state of the resins can be attained at a low temperature.

As the solvent, mention may be made of dimethylformamide (DMF), normal methylpyrrolidone (NMP), methylene chloride and the like.

In the adhesive according to the invention, it is desirable that the compounding ratio of the uncured thermosetting resin or photosensitive resin to the uncured thermoplastic resin in the heat-resistant resin matrix is 15–50 wt % as a content of thermoplastic resin.

When the content of thermoplastic resin is less than 15 wt %, the toughness of the adhesive layer can not be improved, while when it exceeds 50 wt %, it is difficult to apply the adhesive and to form a smooth and uniform adhesive layer.

In the invention, the viscosity of the adhesive is desirable to be 0.5–10 Pa.s measured at 25° C. When the viscosity exceeds 10 Pa.s, the leveling property is decreased and the smooth adhesion surface can not be obtained, while when it is less than 0.5 Pa.s, the settlement of the heat-resistant resin powder is caused and the sufficient roughened surface can not be obtained and the adhesion property to electroless plated layer lowers.

In the adhesive layer for electroless plating according to the invention, the resin composite of the thermoplastic resin and the thermosetting resin or photosensitive resin is used as a resin matrix.

Thus, there can be provided the adhesive layer for electroless plating having an excellent adhesion property to the electroless plated layer.

The reason why the resin composite of the thermoplastic resin and the thermosetting resin or photosensitive resin is used as the heat-resistant resin matrix for the adhesive layer is due to the fact that the properties inherent to the thermosetting or photosensitive resin and the toughness inherent to the thermoplastic resin can be developed by the resin composite and hence the toughness of the resin matrix as a whole can be increased without lowering the heat resistance, elasticity, electrical insulation and chemical stability.

In the adhesive layer for the electroless plating, tile resin composite is desirable to have a quasi-homogeneous compatible structure, co-continuous phase structure or spherical domain structure.

The term "quasi-homogeneous compatible structure" used herein means a state that in the resin composite of the thermosetting or photosensitive resin and the thermoplastic resin exhibiting a so-called LCST (Low Critical Solution Temperature) type phase diagram, the particle size of the constituting resin particles is not more than 0.1 μm as measured by means of a transmission type electron microscope and the peak value of the glass transition temperature of the resin as measured by dynamic viscoelasticity is one. Such a state is close to an ideal mixed state of the resins and is a new concept uniquely thought out by the inventors. The conditions for the measurement of dynamic viscoelasticity are a vibration frequency of 6.28 rad/sec and a temperature rising rate of 5° C./min.

That is, the quasi-homogeneous compatible structure is a more homogeneous structure exhibiting an effect of introducing properties higher than that inherent to the thermoplastic resin such as polyether sulfon (PES) or the like while maintaining the properties inherent to the thermosetting resin such as epoxy resin or the photosensitive resin such as acrylic resin, and is very strong in the interaction between the thermosetting resin or photosensitive resin and the thermoplastic resin.

The structure of this resin composite is confirmed from a fact that the broken surface state of the resin composite is unchangeable and homogeneous even after the etching with a solvent dissolving the thermoplastic resin.

In the resin composite forming the quasi-homogeneous compatible structure, the breaking strength and the tensile strength are higher than those of each resin constituting the resin composite.

The effect by the structure of this resin composite is particularly conspicuous when the content of the thermoplastic resin (e.g. PES) in the resin composite is 15–50 wt % as a solid content. When the content of the thermoplastic resin is less than 15 wt %, the molecule of the thermoplastic resin entangling in a net of the resin component is less and the toughening effect is not sufficiently developed, while when it exceeds 50 wt %, the interaction between the thermoplastic resin and the thermosetting or photosensitive resin becomes small due to the decrease of the crosslinking point number.

The quasi-homogeneous structure is formed by dissolving the uncured thermosetting or photosensitive resin and the uncured thermoplastic resin in a solvent, if necessary, and uniformly mixing them and then speeding up the curing rate and/or delaying the phase separation rate so as to have a particle size of the constituting resin particle of not more than 0.1 μm as measured by means of a transmission type electron microscope.

Concretely, in the first method according to the invention, the curing is carried out at a curing rate exceeding a quasi-homogeneous phase forming point determined by at least one factor selected from curing temperature of thermosetting resin, kind of curing agent and presence or absence of photosensitivity in case of using the thermosetting resin, or at a curing rate exceeding a quasi-homogeneous phase forming point determined by photocuring factors of photosensitive resin such as initiator, sensitizer, photosensitive monomer, exposure conditions and the like in case of using the photosensitive resin. The term "quasi-homogeneous phase forming point" used herein means a lower limit of the curing rate capable of obtaining such a quasi-homogeneous compatible structure that the particle size of the resin particle constituting the composite is not more than 0.1 μm as a value measured by TEM observation.

In the second method according to the invention, the curing is carried out at a phase separation rate not exceeding a quasi-homogeneous phase forming point determined by at least one of crosslinking density and molecular weight of the uncured thermosetting resin or uncured photosensitive resin. In this case, the term "quasi-homogeneous phase forming point" means an upper limit of the phase separation rate capable of obtaining such a quasi-homogeneous compatible structure that the particle size of the resin particle constituting the composite is not more than 0.1 μm as a value measured by TEM observation.

In the third method according to the invention, the curing is carried out at a curing rate exceeding the quasi-homogeneous phase forming point and at a phase separation rate not exceeding the quasi-homogeneous phase forming point. This means the case that the factors determining the curing rate and the phase separation rate influence with each other.

Then, the interrelation among the above factors determining the curing rate and the phase separation rate will be described. At first, the factor determining the curing rate is as follows when the other factors are constant:

(1) The curing rate becomes faster as the curing temperature of the thermosetting resin is high.

That is, when the thermosetting resin is cured so as to exceed the lower limit of the curing temperature required for the provision of the curing rate exceeding the quasi-homogeneous phase forming point, the structure of the resulting resin composite is a quasi-homogeneous compatible structure.

(2) The curing rate becomes faster as the gel time is short.

That is, when the thermosetting resin is cured by using a curing agent so as not to exceed the upper limit of the gel time required for the provision of the curing rate exceeding the quasi-homogeneous phase forming point, the structure of the resulting resin composite is a quasi-homogeneous compatible structure.

(3) The curing rate becomes faster as the photosensitivity is imparted.

That is, when the photosensitivity is imparted to the resin in the combination of other factors forming the quasi-homogeneous compatible structure, the resulting resin composite is a more quasi-homogeneous compatible structure.

As a method of imparting the photosensitivity, there are a method of introducing a photosensitive group into the thermosetting resin or the thermoplastic resin and a method of compounding a photosensitive monomer, in which a photo-initiator and photosensitizer may be added, if necessary.

Moreover, a photosensitive resin such as acrylic resin or the like can be used instead of the thermosetting resin. In this case, it is necessary that the photosensitive resin should be cured at a curing rate exceeding the quasi-homogeneous phase forming point determined by photocuring factors such as initiator, sensitizer, photosensitive monomer, exposure conditions and the like.

Figure 10:
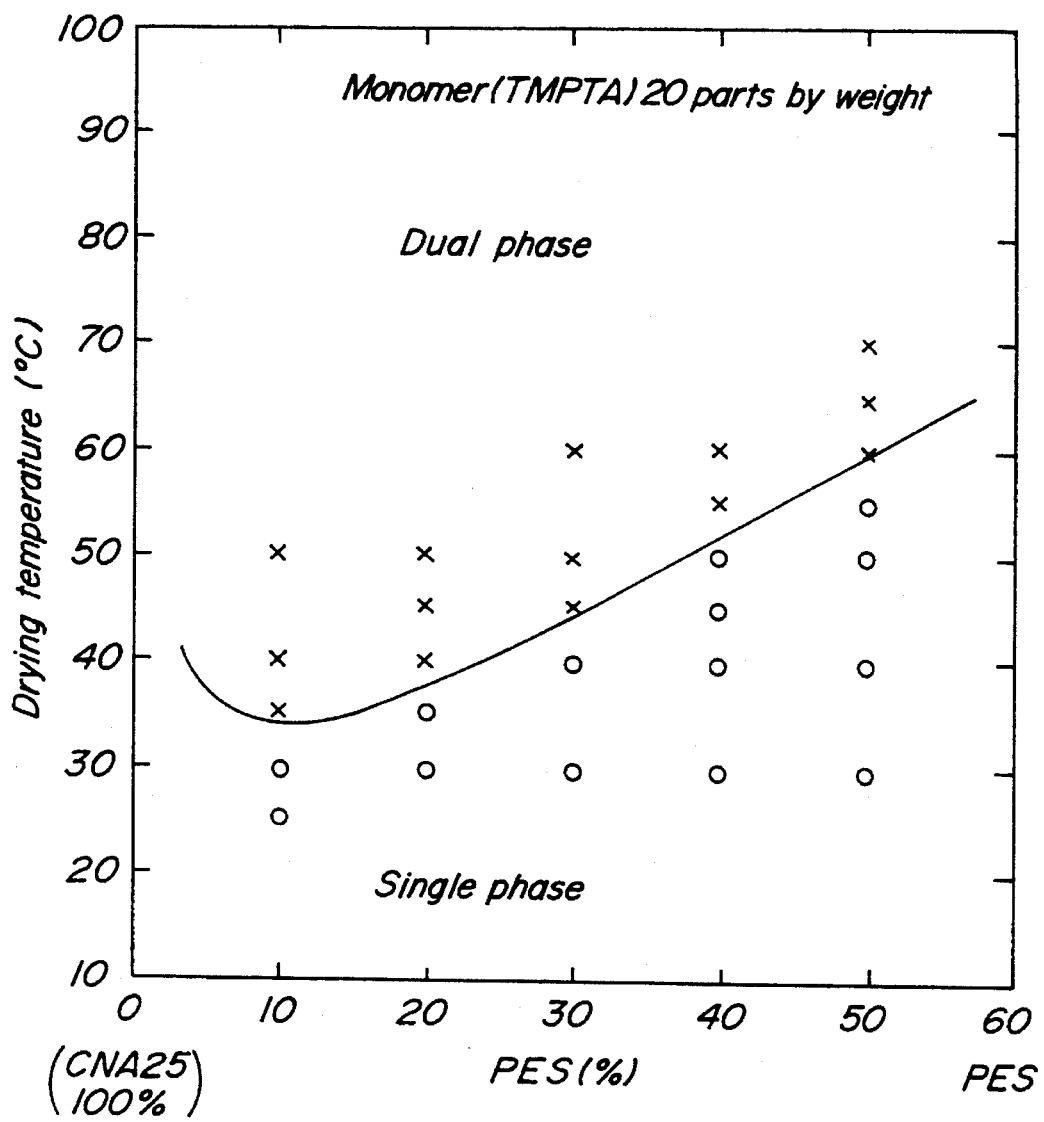
FIG. 10 is a phase diagram showing a relationship between drying temperature of CNA 25/PES/TMPTA mixture and state of resin composite after the curing.
Figure 11:
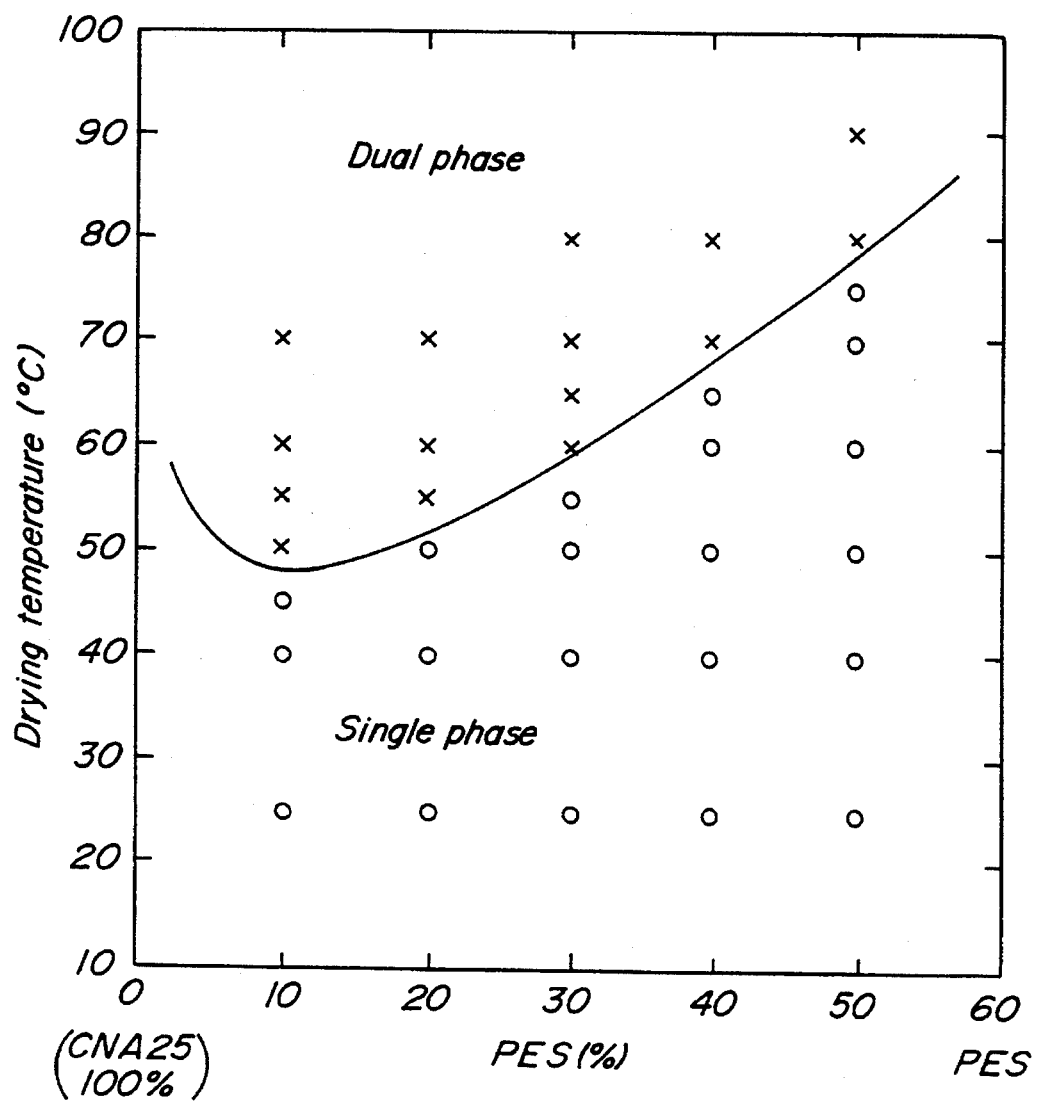
FIG. 11 is a phase diagram showing a relationship between drying temperature of CNA 25/PES mixture and state of resin composite after the curing.
Figure 12:
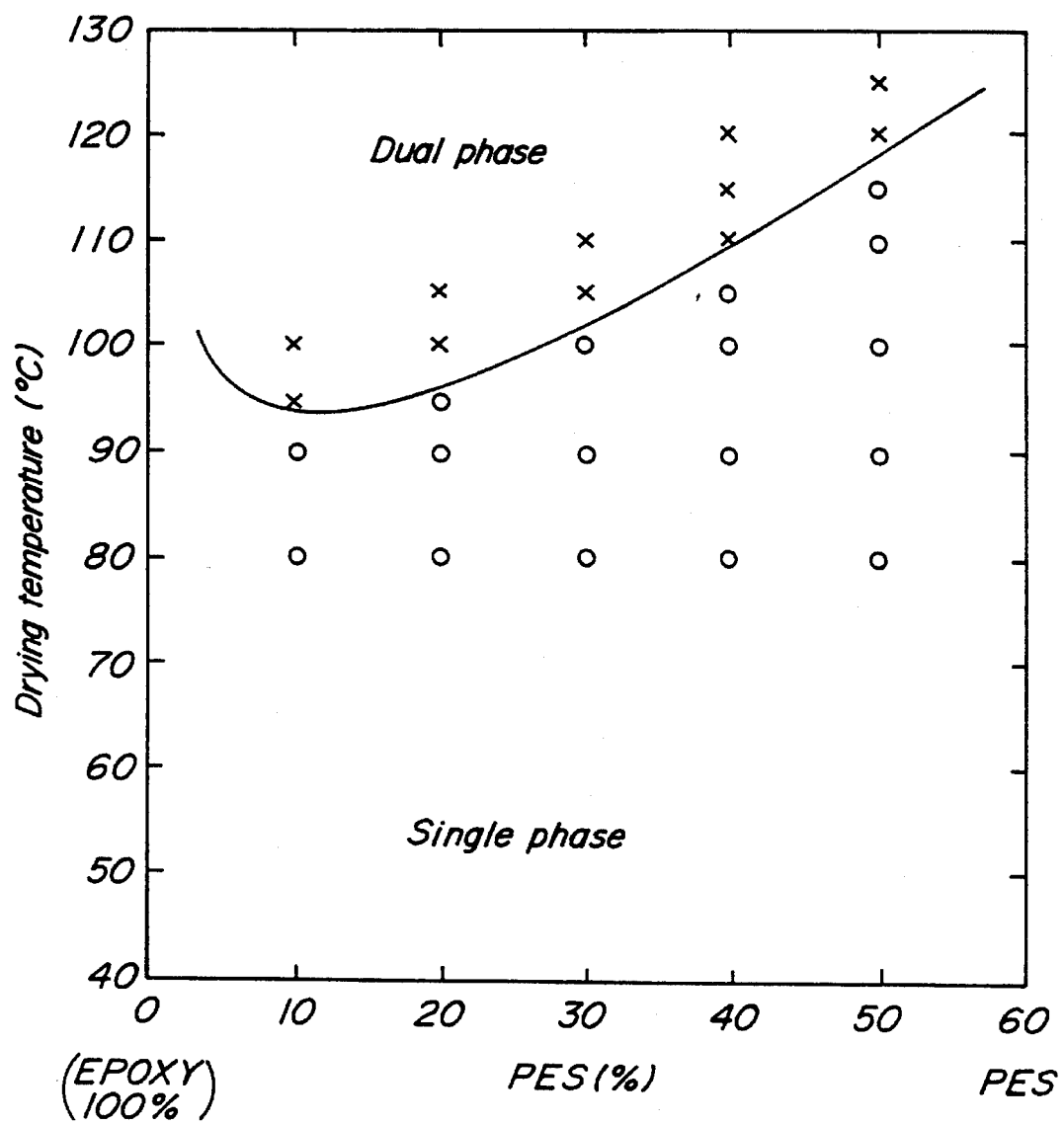
FIG. 12 is a phase diagram showing a relationship between drying temperature of epoxy/PES mixture and state of resin composite after the curing.

However, when the photosensitivity is given to the thermosetting resin, or when the photosensitive monomer is used for improving the resolution in the development, the compatibility of the uncured thermosetting resin or the uncured photosensitive resin with the thermoplastic resin lowers to cause phase separation at a relatively low temperature (see FIGS. 10–12).

Therefore, when the photosensitivity is given to the thermosetting resin, or when the photosensitive monomer is used, the adhesive is dried at a low temperature (30°–60° C.) and, if necessary, under vacuum and cured by exposure to light at once and then heat-cured (80°–200° C.), whereby the quasi-homogeneous compatible structure can be obtained.

Considering the above facts, when the variable factor in the compositing between the thermosetting resin or photosensitive resin and the thermoplastic resin is one, the value of the factor corresponding to the quasi-homogeneous phase forming point is one point. If the factors are two or more, the value of the factor corresponding to the quasi-homogeneous phase forming point is considered to be various combinations. That is, the combination for the curing rate can be selected so as to satisfy that the particle size of the resin constituting the composite is not more than 0.1 μm as measured by TEM observation.

Next, the factor determining the phase separation rate is as follows when the other factors are constant:

(1) It is difficult to produce the phase separation as the crosslinking density of the uncured thermosetting resin or uncured photosensitive resin becomes high (the phase separation rate becomes slow).

Therefore, when the curing is carried out by using the uncured thermosetting resin or uncured photosensitive resin with a crosslinking density exceeding the lower limit of the crosslinking density required for the provision of the phase separation rate not exceeding the quasi-homogeneous phase forming point, the resulting resin composite has a quasi-homogeneous compatible structure.

(2) It is difficult to produce the phase separation as the molecular weight of the uncured thermosetting resin or uncured photosensitive resin becomes large (the phase separation rate becomes slow).

Therefore, when the curing is carried out by using the uncured thermosetting resin or uncured photosensitive resin with a molecular weight exceeding the lower limit of the molecular weight required for the provision of the phase separation rate not exceeding the quasi-homogeneous phase forming point, the resulting resin composite has a quasi-homogeneous compatible structure.

Considering the above facts, when the variable factor in the compositing between the thermosetting resin or photosensitive resin and the thermoplastic resin is one, the value of the factor corresponding to the quasi-homogeneous phase forming point is one point. If the factors are two or more, the value of the factor corresponding to the quasi-homogeneous phase forming point is considered to be various combinations. That is, the combination for -the phase separation rate can be selected so as to satisfy that the particle size of the resin constituting the composite is not more than 0.1 μm as measured by TEM observation.

In the resin composite having such a quasi-homogeneous compatible structure, epoxy resin can be used as a thermosetting resin. In this case, the epoxy resin is desirable to have an epoxy equivalent of about 100–1,000. Because, it is difficult to produce the epoxy resin having an epoxy equivalent of less than 100, while when the epoxy equivalent exceeds 1,000, it is difficult to mix with the thermoplastic resin such as PES or the like and also the phase separation is caused by heating for the curing due to the lowering of Tg point to hardly provide the quasi-homogeneous compatible structure. The molecular weight of the epoxy resin is preferably 300–10,000. When the molecular weight is less than 300, the molecular weight between the crosslinking points is too small and the sufficient heat resistance is not obtained, while when it exceeds 10,000, the compatibility with the thermoplastic resin lowers.

Further, PES can be used as the thermoplastic resin. In this case, the molecular weight of PES is desirable to be 3,000–100,000. When the molecular weight of PES is less than 3,000, the effect of improving the toughness of the quasi-homogeneous compatible structure is not obtained, while when it exceeds 100,000, the compatible state with the thermosetting or photosensitive resin can not be formed.

The resin composite formed by the above methods possesses the properties inherent to the thermosetting resin such as epoxy resin or the photosensitive resin such as acrylic resin and can exhibit properties higher than those inherent to the thermoplastic resin such as PES. That is, PES-modified epoxy resin or PES-modified acrylic resin is high in the strength as compared with that of the PES resin alone and has the strengthening effect of the epoxy resin or the photosensitive resin, which has never been attained in the conventional technique.

The term "co-continuous phase structure" used herein means a composite structure in which spherical particles containing richthermosetting resin such as epoxy resin or the like are continuously existent in the matrix containing rich thermoplastic resin such as PES or the like (written by T. INOUE et al., POLYMER, 30 (1989), page 662).

Such a sturcuture of the resin composite is confirmed from the fact that when the broken face of the resin composite is etched with a solvent dissolving the thermoplastic resin, the matrix portion of rich thermoplastic resin is dissolved to observe only the connected spherical particles of the epoxy resin or the like.

The resin composite forming the co-continuous phase structure is large in the toughness as compared with the thermosetting resin such as epoxy resin alone because the thermoplastic resin having an excellent toughness is existent in form of continuous phase.

The term "spherical domain structure" used herein means a state that spherical domains of thermosetting resin or photosensitive resin are separately and uniformly dispersed into the matrix of the thermmoplastic resin.

Such a structure of the resin composite is confirmed from the fact that when the broken face of the resin composite is etched with a solvent dissolving the thermoplastic resin, the matrix portion of rich thermoplastic resin is dissolved to observe only the separately and uniformly dispersed spherical particles of the epoxy resin.

The resin composite forming such a spherical domain structure is more tough than the thermosetting resin alone because the spherical particles of the thermosetting resin are dispersed into a "sea" of the thermoplastic resin.

The effect by the co-continuous phase structure or spherical domain structure of the resin composite becomes particularly conspicuous when the content of the thermoplastic resin (e.g. PES) in the resin composite is 15–50 wt % as a solid content. When the content of the thermoplastic resin is less than 15 wt %, the molecule of the thermoplastic resin entangling in a net of the resin component is less and the toughening effect is not sufficiently developed, while when it exceeds 50 wt %, the interaction between the thermoplastic resin and the thermosetting or photosensitive resin becomes small due to the decrease of the crosslinking point number.

In the resin composite, the average particle size of the spherical particles constituting the co-continuous phase structure or spherical domain structure is desirable to be more than 0.1 μm but not more than 5 μm. When the average particle size of the spherical particle is not more than 0.1 μm, it is difficult to form the co-continuous phase structure or spherical domain structure, while when it exceeds 5 μm, the improvement of the toughness can not be attained and the photosensitivity and the heat resistance are degraded.

Moreover, the aforementioned co-continuous phase structure or spherical domain structure is formed by controlling the substitution ratio of functional group and photosensitive group contributing to the thermosetting of the thermosetting resin or adjusting the kind and molecular weight of the photosensitive resin to mix the uncured thermosetting or phtosensitive resin with the thermoplastic resin at a compatible or incompatible state and thereafter adjusting the drying or curing conditions so as to have an average particle size of the constituted spherical particles of more than 0.1 m but not more than 5 μm.

And also, the thermosetting resin or the photosensitive resin is used as the resin matrix, and the thermoplastic resin may be used as a resin forming connected or independent spherical domains.

As mentioned above, the resin composite constituting the adhesive layer according to the invention is desirable to form the quasi-homogeneous compatible structure, co-continuous phase structure or spherical domain structure. Among them, the formation of the quasi-homogeneous compatible structure is high in the resin strength as compared with the co-continuous phase or spherical domain structure, so that it is favorable to form the quasi-homogeneous compatible structure as the resin matrix for the adhesive layer.

Moreover, the thickness of the adhesive layer according to the invention is desirable to be 10–200 μm. When the thickness is less than 10 μm, the peel strength lowers, while when it exceeds 200 μm, the solvent in the adhesive is hardly removed and it is difficult to conduct the drying and curing.

The printed circuit board according to the invention comprises a substrate, an adhesive layer formed thereon by dispersing a cured heat-resistant resin powder soluble in an acid or oxidizing agent into a heat-resistant resin matrix hardly soluble in the oxidizing agent after the curing treatment and a conductor circuit formed on a toughened surface of the adhesive layer after the removal of the heat-resistant resin powder through dissolution, and lies in that the heat-resistant resin matrix is a resin composite of a thermoplastic resin and a thermosetting or photosensitive resin. In this case, the resin composite is preferable to have a quasi-homogeneous compatible structure, co-continuous phase structure or spherical domain structure.

The roughened surface is desirable to have Rmax=1–20 μm. When Rmax is less than 1 μm, the desired adhesion strength is not obtained, while when it exceeds 20 μm, it is difficult to produce printed circuit boards of fine pattern having a pattern pitch of not more than 100 μm.

According to such a printed circuit board, the heat-resistant resin matrix constituting the adhesive can be roughened without lowering the heat resistance, modulus of elasticity, chemical stability and electrical insulation, and hence the printed circuit board having high density and pattern accuracy and excellent peel strength can stably be provided.

In the adhesive, adhesive layer for electroless plating and printed circuit board according to the invention as mentioned above, a phenolic resin, an amino resin such as melamine resin, urea resin or the like, an epoxy resin, an epoxy-modified polyimide resin, an unsaturated polyester resin, a polyimide resin, an urethane resin, a diallyl phthalate resin and so on may be used as a thermosetting resin used in the heat-resistant resin matrix because these resins are excellent in thermal and delectrical properties. In the thermosetting resin, a part of functional groups contributing to the thermosetting may locally be substituted with a photosensitive group. For example, 5–70% acrylated epoxy resin is preferable.

As the thermoplastic resin used in the heat-resistant resin matrix, mention may be made of polyether sulphone (PES), polysulphone (PSF), phenoxy resin, polyether imide (PEI), polystyrene, polyethylene, polyarylate, polyamidoimide, polyphenylene sulfide, polyether ether ketone, polyoxybenzoate, polyvinyl chloride, polyvinyl acetate, polyacetal, polycarbonate and the like. These thermoplastic resins are high in heat resistance and toughness and can be made compatible with the thermosetting resin by using a solvent.

Among them, the epoxy resin and the polyether sulphone are favorable as the thermosetting resin and the thermoplastic resin, respectively.

In particular, the quasi-homogeneous compatible structure, co-continuous phase structure or spherical domain structure can easily be formed by mixing and dispersing the epoxy resin and PES as a component of the resin matrix in a solvent such as methylene chloride, dimethyl formamide or the like.

For example, it has been confirmed that when a mixed system of epoxy resin and PES is used as a heat-resistant resin matrix constituting the adhesive, the PES-modified epoxy resin forms the quasi-homogeneous compatible structure to strengthen the matrix and the tensile strength and the tensile elongation are improved to not lower than 1.5 times as compared with those of the epoxy resin alone. Furthermore, the inventors have confirmed that even when the depth of anchor is same, the peel strength of the electroless plated layer in the printed circuit board using the adhesive or adhesive layer according to the invention in made higher than the case of using only the epoxy resin as the resin matrix owing to the above strengthening of the resin matrix.

In the invention, resins provided with photosensitive group, or resins added with a resin or monomer having a photosensitivity may be used as the aforementioned thermosetting resin and/or thermoplastic resin.

In case of the resin composites having the quasi-homogeneous compatible structure, when the photosensitive group is given to the thermosetting resin or the like, the thermosetting resin can be cured and rendered into composite form by exposing to a light for a short time without proceeding the phase separation and hence the quasi-homogeneous compatible structure can easily be formed. In case of the resin composites having the co-continuous phase structure or spherical domain structure, it becomes easy to control the shape of particles (particle size or the like) of the structure.

In the invention, a photosensitive resin may be used instead of the provision of the photosensitive group to the thermosetting resin. As the photosensitive resin, acrylic resins such as methyl polymethacrylate and the like or 100% acrylated product of thermosetting resin are preferable.

As the photoinitiator being important as a photocuring factor of the photosensitive resin, use may preferably be made of at least one compound selected from intramolecular photocleavage type compounds such as benzoisobutyl ether, benzyldimethyl ketal, diethoxyacetophenone, acyloxim ester, chlorinated acetophenone, hydroxyacetophenone and the like and intramolecular hydrogen abstraction type compounds such as benzophenone, Michler's ketone, dibenzosuberone, 2-ethylanthraquinone, isobutylthioxane and the like.

As a photoinitiating assitant, use may be made of at least one of triethanol amine, Michler's ketone, 4,4-diethylaminobenzophenone, 2-dimethylaminoethyl benzoate, ethyl 4-dimethylaminobenzoate, (n-butoxy) ethyl 4-dimethylaminobenzoate, isoamyl 4-dimethylaminobenzoate, 2-ethylhexyl 4-dimethylaminobenzoate, polymerizable tertiary amine and the like.

As a photosensitizer, Michler's ketone, Irgaqua 651, isopropylthioxanthone and the like are preferable. Some of the above initiators act as a photosensitizer. Moreover, a composition ratio of the photoinitiator and the photosensitizer based on 100 parts by weight of the photosensitive resin is preferable as follows.

benzophenone/Michler's ketone=5 parts by weight/0.5 part by weight;

Irgaqua 184/Irgaqua 651=5 parts by weight/0.5 part by weight;

Irgaqua 907/isopropylthioxanthone=5 parts by weight/0.5 part by weight.

As a photosensitive monomer or photosensitive oligomer constituting the photosensitive resin, epoxy acrylate, epoxy methacrylate, urethane acrylate, polyester acrylate, polystyryl methacrylate and the like are favorably used.

According to the invention, when the epoxy resin is used as the thermosetting resin, imidazole type curing agent, diamine, polyamine, polyamide, anhydrous organic acid, vinylphenol or the like can be used as a curing agent for the resin matrix. On the other hand, when using the thermosetting resin other than the epoxy resin, well-known curing agents may be used.

The heat-resistant resin powder used in the invention will be described below.

According to the invention, the heat-resistant resin powder is required to be cured. Because, the heat-resistant resin powder after the curing treatment becomes insoluble in the solvent dissolving the thermosetting resin, thermoplastic resin and photosensitive resin, so that the cured heat-resistant resin powder can uniformly be dispersed into the resin solution by reducing the viscosity of the resin solution through the dilution of the above solvent. Further, in case of obtaining the resin composite of the quasi-homogeneous compatible structure, a solvent is used for mixing the thermosetting resin or photosensitive resin with the thermoplastic resin at a compatible state, Even in this case, clear anchor can be formed because the cured heat-resistant resin powder is not dissolved in this solvent.

As the heat-resistant resin powder according to the invention, use may be made of epoxy resin, amino resin (melamine resin, urea resin, guanamine resin), polyester resin, bismaleimide-triazine resin and the like.

Moreover, rubbers such as butadiene, ABS resin and the like, which do not belong to the heat-resistant resin powder defined in the invention, may be used instead of the heat-resistant resin powder.

In the invention, epoxy resin can be used as a thermosetting resin component for the heat-resistant resin matrix insoluble in an acid or oxidizing agent, while epoxy resin may be used as a heat-resistant resin powder soluble in the acid or oxidizing agent. This will be described with respect to the solubility to the oxidizing agent.

The properties of the epoxy resin can largely be changed by controlling prepolymer of the epoxy resin (a polymer having a relatively low molecular weight of about 300–10000), kind of curing agent and crosslinking density.

The difference of the properties holds true for the solubility to the oxidizing agent, and can be adjusted to an optional solubility by properly selecting (1) kind of prepolymer, (2) kind of curing agent and (3) crosslinking density.

For example, (A) a resin obtained by selecting an alicyclic epoxy as an epoxy prepolymer, using a straight aliphatic polyamine curing agent as a curing agent and moderately crosslinking them so as to render a crosslinking-point molecular weight (the larger the molecular weight between crosslinking points, the lower the crosslinking density) into about 700 is used as "epoxy resin soluble in oxidizing agent" for constituting the heat-resistant resin powder.

On the other hand, (B) a resin obtained by selecting bisphenolic A-type epoxy resin as an epoxy prepolymer, using an aromatic diamine curing agent as a curing agent and crosslinking them so as to render a crosslinking-point molecular weight into about 500, or (C) a resin obtained by selecting phenol novolac-type epoxy resin as an epoxy prepolymer, using a curing agent of acid anhydride as a curing agent and crosslinking them so as to render a crosslinking-point molecular weight into about 400 is used as "epoxy resin hardly soluble (insoluble) in oxidizing agent" for constituting the thermosetting resin component in the heat-resistant resin matrix.

Moreover, the above epoxy resin (B) may be used as "epoxy resin soluble in oxidizing agent". In this case, the above epoxy resin (C) is adopted as "epoxy resin hardly soluble in oxidizing agent".

As mentioned above, the epoxy resin may be adjusted to optional solubility by properly selecting (1) kind of prepolymer, (2) kind of curing agent and (3) crosslinking density.

As seen from the above example, the fact that the epoxy resin is soluble in the oxidizing agent or hardly soluble (or insoluble) in the oxidizing agent means a relative dissolving rate to the oxidizing agent, so that the epoxy resin having a solubility difference may optionally selected as the epoxy resin fine powder soluble or insoluble in the oxidizing agent. Moreover, the provision of the solubility difference to the resin is not restricted to the adjustment of (1) kind of prepolymer, (2) kind of curing agent and (3) crosslinking density and may take another means.

The following Table 1 shows prepolymer, curing agent, crosslinking density and solubility in the aforementioned epoxy resins.

TABLE 1

| | Prepolymer | Curing agent | Molecular weight crosslinking point | Relative value of solubility |
|---|---|---|---|---|
| Epoxy resin A | Alicyclic epoxy glycidyl amine type epoxy | Straight aliphatic Polyamine | about 700 | 200–1000 |
| Epoxy resin B | Bisphenolic A-type epoxy Bisphenolic F-type epoxy | Dicyandiamide Aromatic diamine | about 500 | 50–70 |
| Epoxy resin C | Phenolic novolac type epoxy Cresol novolac type epoxy | Imidazole Acid anhydride | about 400 | 1 |

According to the invention, the oxidation treatment is conducted by utilizing the solubility difference of the above epoxy resin for a given time. The above treatment violently creates the dissolution of the soluble epoxy resin fine powder having a greatest solubility to the oxidizing agent to form a large depression. Simultaneously, the epoxy resin matrix including the thermoplastic resin hardly soluble in the oxidizing agent is left to form a roughened surface (anchor) as shown in FIG. 1.

In the invention, a mixture of epoxy resin and thermoplastic resin such as PES or the like is used as the heat-resistant resin matrix. That is, the incorporation of the thermoplastic resin tends to decrease the solubility to the acid or oxidizing agent. Particularly, the decrease of the solubility is conspicuous in case of adopting the resin composite of quasi-homogeneous compatible structure as the heat-resistant resin matrix.

As the heat-resistant resin powder, in the invention, use may be made of various shapes such as particle, hollow body, crushed body and the like. Particularly, the particles are desirable to be selected from (1) particles having an average particle size of not more than 10 μm, (2) aggregate particles having an average particle size of 2–10 μm by aggregating heat-resistant resin powder having an average particle size of not more than 2 μm, (3) a mixture of heat-resistant resin powder having an average particle size of 2–10 μm and heat-resistant resin powder having an average particle size of not more than 2 μm, and (4) false-particle obtained by adhering at least one of heat-resistant resin powder having an average particle size of not more than 2 μm and inorganic powder having an average particle size of not more than 2 μm to surfaces of heat-resistant resin powder having an average particle size of 2–10 μm. When the average particle size exceeds 10 μm, the anchor becomes deep and a so-called fine pattern of not more than 100 μm can not be formed, while the use of the false-particles described in the above items (2)–(4) is desirable owing to the formation of complicated anchor and the improvement of peel strength.

The heat-resistant resin powder is desirable to be coated with silica sol or the like for the prevention of the aggregation.

The amount of the heat-resistant resin powder added is desirable to be 5–100 as a weight ratio per 100 of resin solid content in the heat-resistant resin matrix. When the weight ratio is less than 5, the anchor can not be formed, while when it exceeds 100, the kneading is difficult and the amount of the heat-resistant resin matrix is relatively decreased to lower the strength of the adhesive layer.

The production of the printed circuit board using the aforementioned adhesive or adhesive layer according to the invention will be described below.

(1) At first, an adhesive according to the invention, i.e. an adhesive composed of a mixed resin of so-called uncured thermosetting or photosensitive resin with thermoplastic resin is applied to a substrate, or the adhesive itself is semi-cured to form a film and the film is laminated on the substrate, or the substrate itself is formed by the adhesive to form an adhesive layer. Furthermore, the adhesive layer is dried and cured to form an adhesive layer in which the resin composite constituting the resin matrix has the quasi-homogeneous compatible structure, co-continuous phase structure or spherical domain structure.

(2) Then, at least a part of the heat-resistant resin powder dispersed into the surface of the adhesive layer is dissolved and removed by using an acid or oxidizing agent. In this case, the substrate provided with the adhesive layer is immersed in a solution of the acid or oxidizing agent, or the solution of the acid or oxidizing agent is applied onto the substrate by spraying or the like, whereby the surface of the adhesive layer can be roughened.

As the oxidizing agent roughening the adhesive, there are chromic acid, chromate, permanganate and the like. As the acid, there are hydrochloric acid, sulfuric acid, organic acid and the like.

(3) The roughened adhesive layer formed on the substrate is subjected to an electroless plating.

As the electroless plating, mention may be made of electroless copper plating, electroless nickel plating, electroless tin plating, electroless gold plating, electroless silver plating and the like. Particularly, at least one of the electroless copper plating, electroless nickel plating and electroless gold plating is preferable. Moreover, the electroless plated layer may be subjected to another different electroless plating or electric plating, or may be coated with a solder.

In the electroless plating, a wiring pattern may be drawn by forming a plating resist or the like.

Alternatively, a conductor circuit may be drawn by etching the electroless plated layer over a full surface at a given pattern.

As the thus obtained printed circuit board, mention may be made of (1) one-side surface printed circuit board obtained by forming plated resist and conductor circuit on the substrate through the adhesive layer, (2) both-surfaces printed circuit board obtained by forming plated resist arid conductor circuit on both surfaces of the substrate through the adhesive layer and through-holes, and (3) build-up multi-layer printed circuit board obtained by forming conductor circuit on the substrate provided with first conductor layer through interlaminar insulation layer (the above adhesive layer) having via-holes at multi-layer state.

Moreover, the adhesive for electroless plating according to the invention can favorably be applied to fields other than the printed circuit board such as building materials, plated materials and parts in the automobile and so on.

The following examples are given in illustration of the invention and are not intended as limitations thereof.

EXAMPLE 1

Thermosetting Resin+Thermoplastic Resin (1) 70 parts by weight of cresol-novolac type epoxy resin (made by Nippon Kayaku Co., Ltd. trade name: EOCN-104S, epoxy equivalent: 220, molecular weight: 5000), 30 parts by weight of polyether sulphone (PES) (made by ICI, trade name: Victrex, molecular weight: 17000) and 5 parts by weight of an imidazole type curing agent (made by Shikoku Kasei Co., Ltd. trade name: 2E4MZ-CN) are mixed with 20 parts by weight of epoxy resin fine powder (made by Toray Co., Ltd. trade name: Toreparle EP-B) having an average particle size of 5.5 μm and 10 parts by weight of the epoxy resin fine powder having an average particle size of 0.5 μm and added with a mixed solvent of dimethylformamide/butylcellosolve (1/1), during which the viscosity is adjusted to 120 CPS in a homodisper agitating machine, and then the kneading is carried out through three rolls to obtain an adhesive solution.

(2) With reference to FIGS. 1a–1f, the adhesive solution is applied onto a glass-epoxy insulating substrate 1 not provided with copper foil (made by Toshiba Chemical Co., Ltd.) by means of a roll coater (made by Thermatronics Boeki Co., Ltd.), and then dried and cured at 80° C. for 2 hours, 120° C. for 5 hours and 150° C. for 2 hours to obtain an adhesive layer 2 having a thickness of 20 μm.

(3) The substrate provided with the adhesive layer is immersed in an aqueous solution of chromic acid ($CrO_3$, 500 g/l) at 70° C. for 15 minutes to roughen the surface of the adhesive layer, as illustrated in FIG. 1d, which is then immersed in a neutral solution (made by Shipley) and washed with water. The toughened surface is Rmax=10 μm according to JIS-B-0601.

(4) A palladium catalyst (made by Shipley) is applied onto the substrate provided with the roughened adhesive layer to activate the surface of the adhesive layer. After a plating resist 3 is formed according to usual manner, the substrate is immersed in an electroless plating solution for additive having a composition as shown in Table 2 for 11 hours to obtain an electroless copper plated layer 4 having a thickness of 25 μm, whereby a printed circuit board is manufactured.

TABLE 2

| | |
|---|---|
| Copper ($CuSO_4 \cdot 5H_2O$) | 0.06 mol/l |
| Formalin | 0.30 mol/l |
| Sodium hydroxide | 0.35 mol/l |
| EDTA | 0.12 mol/l |
| Additive | slight |
| Plating temperature | 70° C. |
| pH of plating solution | 12.4 |

Moreover, when only the resin corresponding to the matrix of the adhesive used in this example is heat-cured under the above conditions, the cured product contains resin particles having an average particle size of not more than 0.1 μm as measured by TEM.

And also, when the resin mixture containing no epoxy resin fine powder is cured, a peak of glass transition temperature Tg is one as measured by a viscoelastic test under conditions that vibration frequency is 6.28 rad/sec and temperature rising rate is 5° C./min (see FIG. 2).

Figure 3:
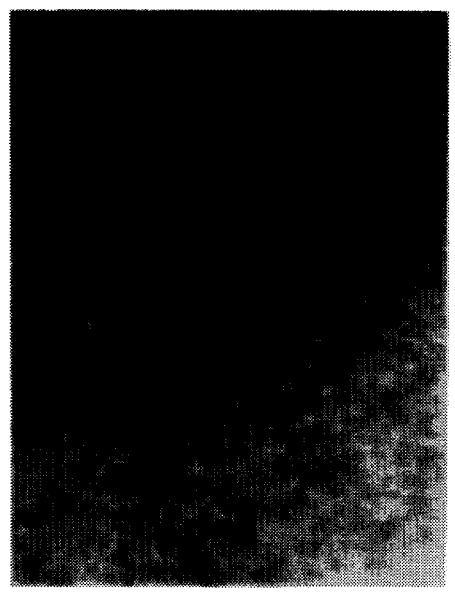
FIG. 3 is an TEM photograph showing a quasi-homogeneous compatible structure of the resin composite according to the invention.

Therefore, it is considered that the matrix for the adhesive used in this example shows a quasi-homogeneous compatible structure (see FIG. 3).

EXAMPLE 2

Thermosetting Resin+Thermoplastic Resin (1) 70 parts by weight of cresol-novolac type epoxy resin (made by Nippon Kayaku Co., Ltd. trade name: EOCN-103S), 30 parts by weight of polyether sulphone (PES-)(made by ICI, trade name: Victrex), and 10 parts by weight of an imidazole type curing agent (made by Shikoku Kasei Co., Ltd. trade name: 2PHZ-CN) are mixed with 20 parts by weight of epoxy resin fine powder (made by Toray Co., Ltd. trade name: Toreparle EP-B) having an average particle size of 5.5 μm and 10 parts by weight of the epoxy resin fine powder having an average particle size of 0.5 μm and added with a mixed solvent of dimethylformamide/butylcellosolve (1/1), during which the viscosity is adjusted to 120 CPS in a homodisper agitating machine, and then the kneading is carried out through three rolls to obtain an adhesive solution.

(2) The adhesive solution is applied onto a glass-epoxy insulating substrate not provided with copper foil (made by Toshiba Chemical Co., Ltd.) by means of a roll coater (made by Thermatronics Boeki Co., Ltd.), and then dried and cured at 80° C. for 3 hours, 120° C. for 3 hours and 150° C. for 5 hours to obtain an adhesive layer having a thickness of 20 μm.

(3) The substrate provided with the adhesive layer is immersed in an aqueous solution of chromic acid ($CrO_3$, 500 g/l) at 70° C. for 15 minutes to roughen the surface of the adhesive layer, which is then immersed in a neutral solution (made by Shipley) and washed with water.

(4) A palladium catalyst (made by Shipley) is applied onto the substrate provided with the roughened adhesive layer to activate the surface of the adhesive layer. After a plating resist is formed according to usual manner, the substrate is immersed in an electroless plating solution for additive having the composition of Table 2 for 11 hours to obtain an electroless copper plated layer having a thickness of 25 μm, whereby a printed circuit board is manufactured.

Moreover, when only the resin corresponding to the matrix of the adhesive used in this example is heat-cured under the above conditions, the cured product contains resin particles having an average particle size of not more than 0.05 μm as measured by TEM.

And also, when the resin mixture containing no epoxy resin fine powder is cured, a peak of glass transition temperature Tg is one as measured by a viscoelastic test under conditions that vibration frequency is 6.28 rad/sec and temperature rising rate is 5° C./min.

Therefore, it is considered that the matrix for the adhesive used in this example shows a quasi-homogeneous compatible structure.

EXAMPLE 3

Thermosetting Resin+Thermoplastic Resin (1) 70 parts by weight of bisphenol A-type epoxy resin (made by Yuka Shell Co., Ltd. trade name: Epikote 828, epoxy equivalent: 190, molecular weight: 380), 30 parts by weight of polyether sulphone (PES) (made by ICI, trade name: Victrex), and 10 parts by weight of an imidazole type curing agent (made by Shikoku Kasei Co., Ltd. trade name: 2E4MZ-CN) are mixed with 20 parts by weight of epoxy resin fine powder (made by Toray Co., Ltd. trade name: Toreparle EP-B) having an average particle size of 5.5 μm and 10 parts by weight of the epoxy resin fine powder having an average particle size of 0.5 μm and added with a mixed solvent of dimethylformamide/butylcellosolve (1/1), during which the viscosity is adjusted to 120 CPS in a homodisper agitating machine, and then the kneading is carried out through three rolls to obtain an adhesive solution.

(2) The adhesive solution is applied onto a glass-epoxy insulating substrate not provided with copper foil (made by Toshiba Chemical Co., Ltd.) by means of a roll coater (made by Thermatronics Boeki Co., Ltd.), and then dried and cured at 80° C. for 1 hour, 120° C. for 2 hours and 150° C. for 4 hours to obtain an adhesive layer having a thickness of 20 μm.

(3) The substrate provided with the adhesive layer is immersed in an aqueous solution of chromic acid ($CrO_3$, 500 g/l) at 70° C. for 15 minutes to roughen the surface of the adhesive layer, which is then immersed in a neutral solution (made by Shipley) and washed with water.

(4) A palladium catalyst (made by Shipley) is applied onto the substrate provided with the roughened adhesive layer to activate the surface of the adhesive layer. After a plating resist is formed according to usual manner, the substrate is immersed in an electroless plating solution for additive having the composition of Table 2 for 11 hours to obtain an electroless copper plated layer having a thickness of 25 μm, whereby a printed circuit board is manufactured.

Moreover, when only the resin corresponding to the matrix of the adhesive used in this example is heat-cured under the above conditions, the cured product contains resin particles having an average particle size of not more than 0.1 μm as measured by TEM.

And also, when the resin mixture containing no epoxy resin fine powder is cured, a peak of glass transition temperature Tg is one as measured by a viscoelastic test under conditions that vibration frequency is 6.28 rad/sec and temperature rising rate is 5° C./min.

Therefore, it is considered that the matrix for the adhesive used in this example shows a quasi-homogeneous compatible structure.

EXAMPLE 4

Thermosetting Resin+Thermoplastic Resin (1) The same procedure as in Example 1 is fundamentally repeated except for the following. That is, 60 parts by weight of bisphenol A-type epoxy resin (made by Yuka Shell Co., Ltd. trade name: Epikote 828), 40 parts by weight of polyether sulphone (PES) (made by ICI, trade name: Victrex), and 5 parts by weight of an imidazole type curing agent (made by Shikoku Kasei Co., Ltd. trade name: 2E4MZ-CN) are mixed with 20 parts by weight of epoxy resin fine powder (made by Toray Co., Ltd. trade name: Toreparle EP-B) having an average particle size of 5.5 μm and 10 parts by weight of the epoxy resin fine powder having an average particle size of 0.5 μm and added with a mixed solvent of dimethylformamide/butylcellosolve (1/1), during which the viscosity is adjusted to 120 CPS in a homodisper agitating machine, and then the kneading is carried out through three rolls to obtain an adhesive solution.

The cured product obtained by curing only the matrix resin for the adhesive in this example is observed to have a continuous structure of spheres (co-continuous phase structure) containing rich epoxy resin with an average particle size of 0.2–2 μm as measured by SEM after etching the section of the cured product with methylene chloride (dissolving PES).

EXAMPLE 5

Thermosetting Resin+Thermoplastic Resin (1) The same procedure as in Example 1 is fundamentally repeated except for the following. That is, 50 parts by weight of bisphenol A-type epoxy resin (made by Yuka Shell Co., Ltd. trade name: Epikote 828), 50 parts by weight of polyether sulphone (PES) (made by ICI, trade name: Victrex), and 5 parts by weight of an imidazole type curing agent (made by Shikoku Kasei Co., Ltd. trade name: 2E4MZ-CN) are mixed with 20 parts by weight of epoxy resin fine powder (made by Toray Co., Ltd. trade name: Toreparle EP-B) having an average particle size of 5.5 μm and 10 parts by weight of the epoxy resin fine powder having an average particle size of 0.5 μm and added with a mixed solvent of dimethylformamide/butylcellosolve (1/1), during which the viscosity is adjusted to 120 CPS in a homodisper agitating machine, and then the kneading is carried out through three rolls to obtain an adhesive solution.

Figure 4:
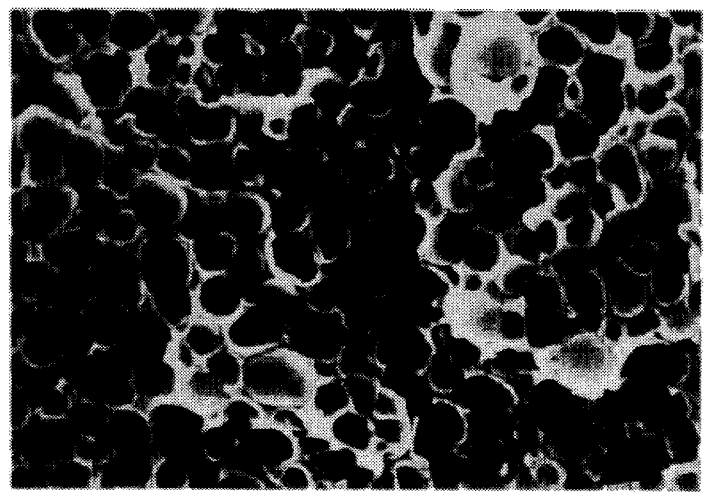
FIG. 4 is an SEM photograph showing a spherical domain structure of the resin composite according to the invention.

The cured product obtained by curing only the matrix resin for the adhesive in this example is observed to have spheres containing rich epoxy resin with an average particle size of about 2–5 μm as measured by SEM after etching the section of the cured product with methylene chloride dissolving PES. The matrix resin is a so-called sea-land structure (spherical domain structure) in which epoxy rich spheres are floated in PES rich base (see FIG. 4).

COMPARATIVE EXAMPLE 1

Only Thermosetting Resin (1) 100 parts by weight of phenol novolac-type epoxy resin (made by Yuka Shell Co., Ltd. trade name: Epikote 154), and 4 parts by weight of an imidazole type curing agent (made by Shikoku Kasei Co., Ltd. trade name: 2P4MHZ) are mixed with 20 parts by weight of epoxy resin fine powder (made by Toray Co., Ltd. trade name: Toreparle EP-B) having an average particle size of 5.5 μm and 10 parts by weight of the epoxy resin fine powder having an average particle size of 0.5 μm and added with a mixed solvent of dimethylformamide/butylcellosolve (1/1), during which the viscosity is adjusted to 120 CPS in a homodisper agitating machine, and then the kneading is carried out through three rolls to obtain an adhesive solution.

(2) The adhesive solution is applied onto a glass-epoxy insulating substrate not provided with copper foil (made by Toshiba Chemical Co., Ltd.) by means of a roll coater (made by Thermatronics Boeki Co., Ltd.), and then dried and cured at 100° C. for 1 hour and 150° C. for 5 hours to obtain an adhesive layer having a thickness of 20 μm.

(3) The substrate provided with the adhesive layer is immersed in an aqueous solution of chromic acid ($CrO_3$, 500 g/l) at 70° C. for 15 minutes to roughen the surface of the adhesive layer, which is then immersed in a neutral solution (made by Shipley) and washed with water.

(4) A palladium catalyst (made by Shipley) is applied onto the substrate provided with the roughened adhesive layer to activate the surface of the adhesive layer. After a plating resist is formed according to usual manner, the substrate is immersed in an electroless plating solution for additive having the composition of Table 2 for 11 hours to obtain an electroless copper plated layer having a thickness of 25 μm, whereby a printed circuit board is manufactured.

In the printed circuit boards of Examples 1–5 and Comparative Example 1, the peel strength of the electroless copper plated layer and the insulation resistance and glass transition point Tg of the adhesive layer are measured. Further, heat cycle test is carried out at −65° C.×30 min to 125° C.×30 min. The measured results are shown in Table 3. As seen from the results of this table, printed circuit boards having considerably improved adhesion strength, insulating property, heat resistance and heat cycle property can be manufactured by using the adhesives according to the invention, which exhibit quasi-homogeneous compatible structure, co-continuous phase structure and spherical domain structure, as compared with the conventional ones.

TABLE 3

|  | Peel strength (kg/cm) | Insulation resistance (Ω) | Tg (°C.) | Heat cycle property | Dielectric resistance |
| --- | --- | --- | --- | --- | --- |
| Example |  |  |  |  |  |
| 1 | 2.8 | $10^{13}$ | 220 | >1000 | 3.5 |
| 2 | 2.6 | $10^{13}$ | 210 | >1000 | 3.4 |
| 3 | 2.5 | $10^{13}$ | 200 | >1000 | 3.4 |
| 4 | 2.1 | $10^{13}$ | 180 | >500 | 3.4 |
| 5 | 1.9 | $10^{13}$ | 180 | >500 | 3.5 |
| Comparative Example |  |  |  |  |  |
| 1 | 1.6 | $10^{11}$ | 160 | <400 | 4.0 |

EXAMPLE 6

Thermosetting Resin (Partly Photosensitized)+Thermoplastic Resin (1) With reference to FIGS. 5a–5f, a photosensitive dry film (made by DuPont) is laminated onto a glass-epoxy copper lined laminated substrate (made by Toshiba Chemical Co., Ltd.) and exposed to an ultra-violet ray through a mask film pictured with a given conductor circuit pattern. Then, the pattern is developed with 1,1,1-trichloroethane, and copper is removed from non-conductor portion with an etching solution of copper chloride, and then the dry film is peeled off with methylene chloride. Thus, there is prepared a printed circuit board 1 having a first conductor circuit layer comprised of plural conductor patterns 4 on the substrate.

(2) To a suspension of epoxy resin particles obtained by dispersing 200 g of epoxy resin particles (made by Toray Co., Ltd. average particle size: 3.9 μm) into 5 liter of acetone is added dropwise a suspension obtained by dispersing 300 g of epoxy resin powder (made by Toray Co., Ltd. average particle size: 0.5 μm) into an acetone solution of 30 g of epoxy resin (made by Mitsui Petroleum Chemical Co., Ltd.) per 1 liter of acetone with stirring in a Henshell mixer, whereby the epoxy resin powder is adhered to the surfaces of the epoxy resin particles. After acetone is removed, the mixture is heated to 150° C. to form false-particles. The false-particles have an average particle size of about 4.3 μm, about 75% by weight of which are existent within a range of ±2 μm around the value of average particle size.

(3) 70 parts by weight of 50% acrylated product of cresol-novolac type epoxy resin (made by Yuka Shell Co., Ltd. epoxy equivalent: 210, molecular weight: 2000), 30 parts by weight of polyether sulphone (PES), 15 parts by weight of diallylterephthalate, 4 parts by weight of 2-methyl-1-[4-(methylthio)phenyl]-2-morpholinopropanone-1 (made by Ciba Geigy) and 4 parts by weight of an imidazole type curing agent (made by Shikoku Kasei Co., Ltd. trade name: 2E4MZ-CN) are mixed with 50 parts by weight of the false-particles prepared in the above item (2), added with butylcellosolve, during which the viscosity is adjusted to 250 CPS in a homodisper agitating machine, and then the kneading is carried out through three rolls to prepare a solution of a photosensitive resin composition.

(4) The solution of the photosensitive resin composition is applied onto the printed circuit board of the above item (1) by means of a knife coater, illustrated as a roll coater in FIG. 5b, left to stand at a horizontal state for 20 minutes and dried at 70° C. to form a photosensitive resin insulating layer 2 having a thickness of about 50 μm.

(5) The printed circuit board treated in the item (4) is closed with a photomask film printed with black circles of 100 μm in diameter, which is exposed to a super-high pressure mercury lamp of 500 mj/cm$^2$. It is subjected to an ultra-sonic development with a solution of chlorocene to form openings as via-holes of 100 μm in diameter on the board. Furthermore, the board is exposed to a super-high pressure mercury lamp at about 3000 mj/cm$^2$ and subjected to a heat treatment at 100° C. for 1 hour and at 150° C. for 5 hours to form an interlaminar resin insulating layer 2 having an opening 5 corresponding to the photomask film in an excellent dimensional accuracy.

(6) The board treated in the item (5) is immersed in an aqueous solution of potassium permanganate (KMnO$_4$, 500 g/l) at 70° C. for 15 minutes to roughen the surface of the interlaminar resin insulating layer, as illustrated in FIG. 5d, which is then immersed in a neutral solution (made by Shipley) and washed with water.

(7) A palladium catalyst (made by Shipley) is applied onto the board provided with the roughened resin insulating layer to activate the surface of the insulating layer, which is immersed in an electroless plating solution for additive having the composition of Table 2 for 11 hours to obtain an electroless copper plated layer 6 having a thickness of 25 μm.

(8) The steps of the items (4)–(7) are repeated 2 times and further the step of the item (1) is repeated to manufacture a build-up multi-layer printed circuit board in which the wiring layers are 4, 6, 8 and 10 (see FIG. 5f).

Figure 6:
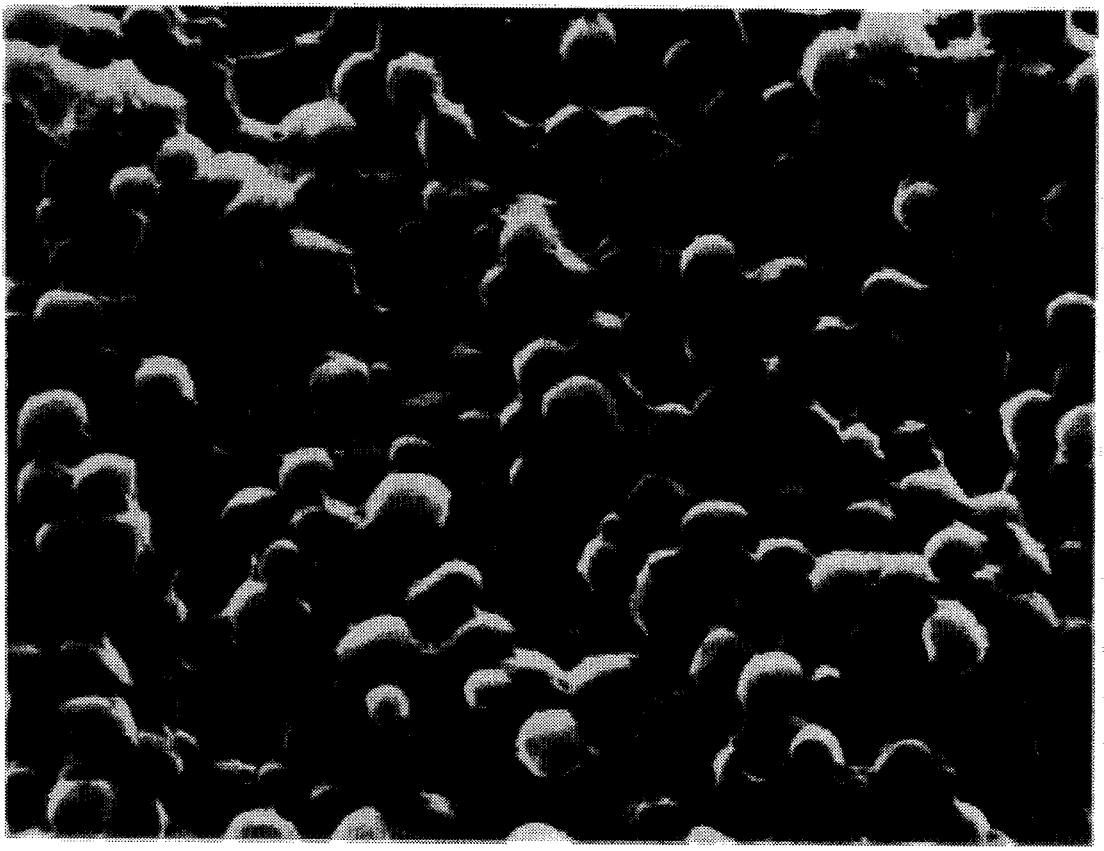
FIG. 6 is an SEM photograph showing a co-continuous phase structure of the resin composite according to the invention.

Moreover, when only the resin corresponding to the matrix for the adhesive used in this example is thermally cured under the above conditions, the continuous structure of epoxy rich spheres having an average particle size of 0.2–2 μm (co-continuous phase structure) is observed as measured by SEM after the section of the cured product is etched with methylene chloride (see FIG. 6).

Figure 7:
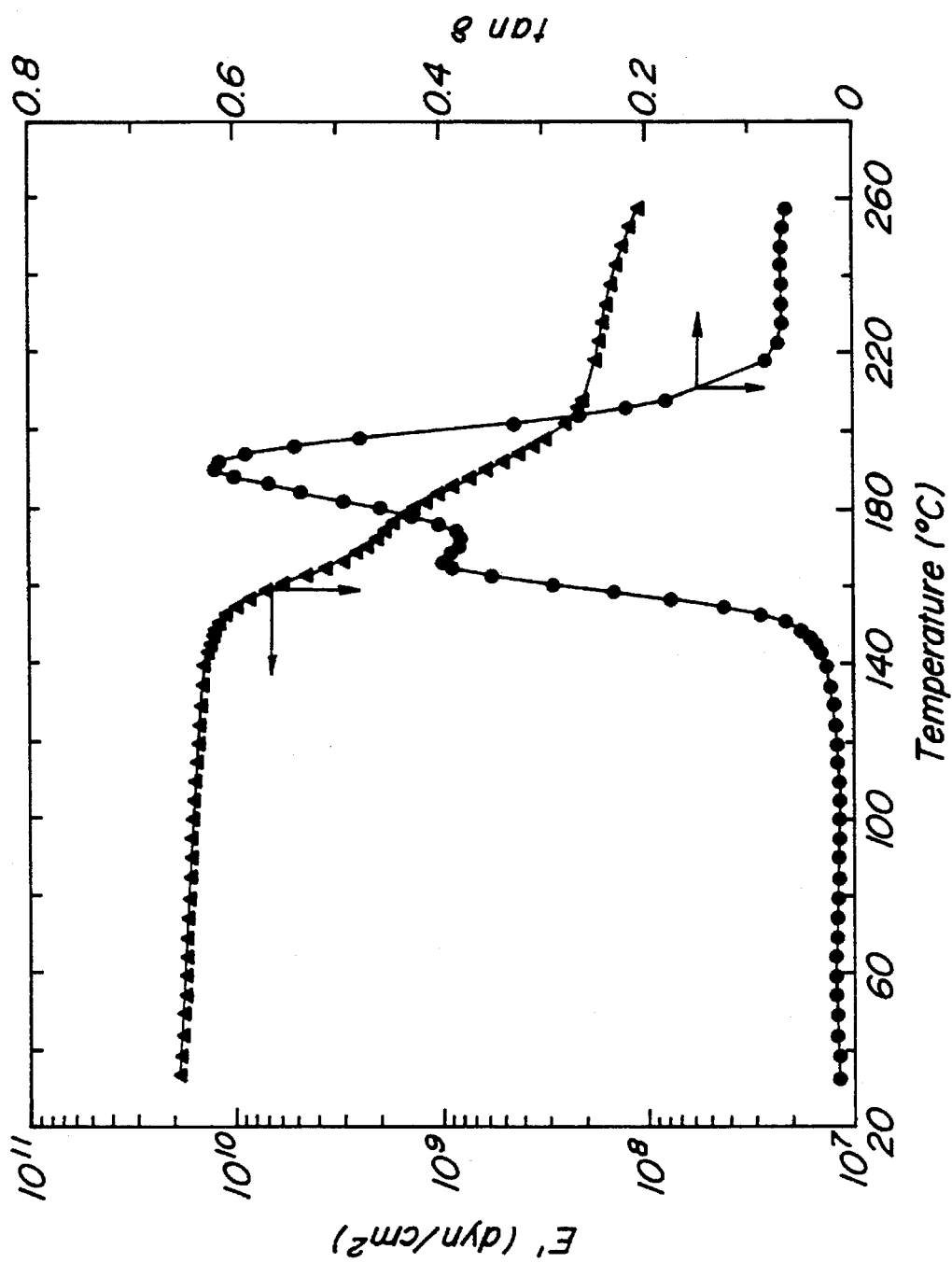
FIG. 7 is a graph showing results of dynamic viscoelasticity measured on the resin composite having a co-continuous phase structure according to the invention.

And also, when the resin mixture containing no epoxy resin fine powder is cured, a peak of glass transition temperature Tg is two as measured by a viscoelastic test under conditions that vibration frequency is 6.28 rad/sec and temperature rising rate is 5° C./min (see FIG. 7).

Therefore, it is considered that the matrix for the adhesive used in this example shows a co-continuous phase structure.

EXAMPLE 7

Thermosetting Resin (Partly Photosensitized)+Thermoplastic Resin (1) The same procedure as in Example 6 is repeated except for the following. That is, 25% acrylated photosensitized oligomer of cresol-novolac type epoxy resin (CNA25, molecular weight: 4000), PES (molecular weight: 17000), imidazole curing agent (made by Shikoku Kasei Co., Ltd., trade name: 2E4MZ-CN), trimethyl triacrylate (TMPTA) as a photosensitive monomer and a photoinitiator (made by Ciba Geigey, trade name: I-907) are mixed according to the following composition recipe in DMF and mixed with 20 parts by weight of epoxy resin fine powder (made by Toray Co., Ltd. trade name: Toreparle EP-B) having an average particle size of 5.5 μm and 10 parts by weight of the epoxy resin fine powder having an average particle size of 0.5 μm, which is adjusted to a viscosity of 120 CPS in a homodisper agitating machine and kneaded through three rolls to obtain an adhesive solution.

Resin composition: photosensitized epoxy/PES/TMPTA/I-907/imidazole= 75/25/10/5/5

The adhesive is dried at 25° C. under vacuum and cured through UV and then thermally cured.

The cured product vacuum dried, cured through UV and thermally cured under the above conditions from only the resin corresponding to the matrix for the adhesive in this example is confirmed to contain resin particles having an average particle size of not more than 0.1 μm as measured by TEM in the same manner as in Example 1.

And also, when the resin mixture containing no epoxy resin fine powder is cured, a peak of glass transition temperature Tg is one as measured by a viscoelastic test under conditions that vibration frequency is 6.28 rad/sec and temperature rising rate is 5° C./min.

Therefore, it is considered that the matrix for the adhesive used in this example shows a quasi-homogeneous compatible structure (see FIG. 3).

Further, FIGS. 8 and 9 show sections of the adhesive layer before and after the curing as SEM photographs, respectively.

EXAMPLE 8

Thermosetting Resin (Partly Photosensitized)+Thermoplastic Resin (1) The same procedure as in Example 6 is repeated except for the following. That is, 25% acrylated photosensitized oligomer of cresol-novolac type epoxy resin (CNA25, molecular weight: 4000), PES (molecular weight: 17000), imidazole curing agent (made by Shikoku Kasei Co., Ltd., trade name: 2E4MZ-CN), trimethyl triacrylate (TMPTA) as a photosensitive monomer and a photoinitiator (made by Ciba Geigey, trade name: I-907) are mixed according to the following composition recipe in DMF and mixed with 20 parts by weight of epoxy resin fine powder (made by Toray Co., Ltd. trade name: Toreparle EP-B) having an average particle size of 5.5 μm and 10 parts by weight of the epoxy resin fine powder having an average particle size of 0.5 μm, which is adjusted to a viscosity of 120 CPS in a homodisper agitating machine and kneaded through three rolls to obtain an adhesive solution.

Resin composition: photosensitized epoxy/PES/TMPTA/ I-907/imidazole= 75/25/10/5/5

The composition of this adhesive is the same as in Example 7, but the adhesive is dried at 50° C. under vacuum and cured through UV and thermally cured different from Example 7.

Moreover, when only the resin corresponding to the matrix for the adhesive used in this example is cured under the above conditions, the continuous structure of epoxy rich spheres having an average particle size of 0.2–2 μm (co-continuous phase structure) is observed as measured by SEM after the section of the cured product is etched with methylene chloride.

EXAMPLE 9

Thermosetting Resin (Partly Photosensitized)+Thermoplastic Resin (1) The same procedure as in Example 6 is repeated except for the following. That is, 25% acrylated photosensitized oligomer of cresol-novolac type epoxy resin (CNA25, molecular weight: 4000), PES (molecular weight: 17000), imidazole curing agent (made by Shikoku Kasei Co., Ltd., trade name: 2E4MZ-CN), trimethyl triacrylate (TMPTA) as a photosensitive monomer and a photoinitiator (made by Ciba Geigey, trade name: I-907) are mixed according to the following composition recipe in DMF and mixed with 20 parts by weight of epoxy resin fine powder (made by Toray Co., Ltd. trade name: Toreparle EP-B) having an average particle size of 5.5 μm and 10 parts by weight of the epoxy resin fine powder having an average particle size of 0.5 μm, which is adjusted to a viscosity of 120 CPS in a homodisper agitating machine and kneaded through three rolls to obtain an adhesive solution.

Resin composition: photosensitized epoxy/PES/TMPTA/ I-907/imidazole= 75/25/10/5/5

The composition of this adhesive is the same as in Example 7, but the adhesive is dried at 80° C. and cured through UV and thermally cured (80°–200°), which is different from Example 7.

Moreover, when only the resin corresponding to the matrix for the adhesive used in this example is cured under the above conditions, the spheres of epoxy rich spheres having an average particle size of about 2– 5 μm are observed as measured by SEM after the section of the cured product is etched with methylene chloride. The matrix resin is a so-called sea-land structure (spherical domain structure) in which the epoxy rich spheres are floated in the PSF rich base.

It has been confirmed from Examples 7–9 that the cured product of quasi-homogeneous compatible structure, co-continuous phase structure or spherical domain structure is obtained from the adhesive having the same composition by changing the drying conditions. In case of the photosensitive adhesive, if the resin is a homogeneous structure at the time of drying, the curing is rapidly conducted by photocuring, so that the phase separation by subsequent thermal curing hardly occurs.

Moreover, the phase diagrams are shown in FIGS. 10–12 for the reference. In these phase diagrams, the preparation conditions are different from Examples 7–9 and are as follows:

Photosensitized epoxy/PES/TMPTA/I-907/imidazole=75/ 25/20/5/5

EXAMPLE 10

Photosensitive Resin+Thermoplastic Resin (1) The same procedure as in Example 6 is repeated except for the following. That is, 100% acrylated photosensitive oligomer of cresol-novolac type epoxy resin (made by Yuka Shell Co., Ltd.), PES, imidazole curing agent (made by Shikoku Kasei Co., Ltd., trade name: 2E4MZ-CN), trimethyl triacrylate (TMPTA) as a photosensitive monomer and a photoinitiator (made by Ciba Geigey, trade name: I-907) are mixed according to the following composition recipe in DMF and mixed with 20 parts by weight of epoxy resin fine powder (made by Toray Co., Ltd. trade name: Toreparle EP-B) having an average particle size of 5.5 μm and 10 parts by weight of the epoxy resin fine powder having an average particle size of 0.5 μm, which is adjusted to a viscosity of 120 CPS in a homodisper agitating machine and kneaded through three rolls to obtain an adhesive solution.

Resin composition: photosensitized epoxy/PES/TMPTA/ I-907/imidazole= 80/20/10/5/5

The adhesive is dried at 25° C. under vacuum and cured through UV and thermally cured.

The cured product vacuum dried, cured through UV and thermally cured under the above conditions from only the resin corresponding to the matrix for the adhesive in this example is confirmed to contain resin particles having an average particle size of not more than 0.1 μm as measured by TEM in the same manner as in Example 1.

And also, when the resin mixture containing no epoxy resin fine powder is cured, a peak of glass transition temperature Tg is one as measured by a viscoelastic test under conditions that vibration frequency is 6.28 rad/sec and temperature rising rate is 5° C./min.

Therefore, it is considered that the matrix for the adhesive used in this example shows a quasi-homogeneous compatible structure (see FIG. 3).

EXAMPLE 11

Photosensitive Resin+Thermoplastic Resin (1) The same procedure as in Example 6 is repeated except for the following. That is, 100% acrylated photosensitive oligomer of cresol-novolac type epoxy resin (made by Yuka Shell Co., Ltd.), phenoxy resin, imidazole curing agent (made by Shikoku Kasei Co., Ltd., trade name: 2E4MZ-CN), trimethyl triacrylate (TMPTA) as a photosensitive monomer and a photoinitiator (made by Ciba Geigey, trade name: I-907) are mixed according to the following composition recipe in DMF and mixed with 30 parts by weight of aggregated epoxy resin fine powder (see Example 1 of JP-A-1-301775) having an average particle size of 3.5 μm, which is adjusted to a viscosity of 120 CPS in a homodisper agitating machine while adding a mixed solvent of dimethylformamide/butylcellosolve (1/1) and kneaded through three rolls to obtain an adhesive solution.

Resin composition: photosensitized epoxy/phenoxy/TMPTA/I-907/imidazole= 70/30/10/5/5

Moreover, when only the resin corresponding to the matrix for the adhesive used in this example is cured under the above conditions, the continuous structure of epoxy rich spheres having an average particle size of 0.2–2 μm (co-continuous phase structure) is observed as measured by SEM after the section of the cured product is etched with 2-butanone (dissolving the phenoxy resin).

EXAMPLE 12

Photosensitive Resin+Thermoplastic Resin (1) The same procedure as in Example 6 is repeated except for the following. That is, 100% acrylated photosensitive oligomer of cresol-novolac type epoxy resin (made by Yuka Shell Co., Ltd.), PES, imidazole curing agent (made by Shikoku Kasei Co., Ltd., trade name: 2E4MZ-CN), trimethyl triacrylate (TMPTA) as a photosensitive monomer and a photoinitiator (made by Ciba Geigey, trade name: I-907) are mixed according to the following composition recipe in DMF and mixed with 30 parts by weight of aggregated epoxy resin fine powder (see Example 1 of JP-A-1-301775) having an average particle size of 3.5 μm, which is adjusted to a viscosity of 120 CPS in a homodisper agitating machine while adding a mixed solvent of dimethylformamide/butylcellosolve (1/1) and kneaded through three rolls to obtain an adhesive solution.

Resin composition: photosensitized epoxy/PSF/TMPTA/I-907/imidazole= 60/40/10/5/5

Moreover, when only the resin corresponding to the matrix for the adhesive used in this example is cured under the above conditions, the spheres of epoxy rich spheres having an average particle size of about 2–5 μm are observed as measured by SEM after the section of the cured product is etched with methylene chloride. The matrix resin is a so-called sea-land structure (spherical domain structure) in which the epoxy rich spheres are floated in the PSF rich base.

COMPARATIVE EXAMPLE 2

Only Thermosetting Resin (1) The same procedure as in Example 6 is repeated except for the following. That is, a solution of photosensitive resin composition containing false-particles of epoxy resin is prepared according to the following resin composition, and interlaminar resin insulating layer having a thickness of about 50 μm and electroless copper plated layer having a thickness of 25 μm are alternately formed on the printed circuit board having the first conductor circuit layer to manufacture a build-up multi-layer printed circuit board of 4 wiring layers.

Resin Composition, by Weight (1) 50% acrylated product of cresol-novolac type epoxy resin (made by Yuka Shell Co., Ltd.): 60 parts (2) bisphenol A-type epoxy resin (made by Yuka Shell Co., Ltd.): 40 parts (3) diallylterephthalate: 15 parts (4) 2-methyl-1-[4-(methylthio)phenyl]-2-morpholinopropanone-1 (made by Ciba Geigey): 4 parts (5) imidazole type curing agent (made by Shikoku Kasei Co., Ltd. trade name: 2P4MHZ): 4 parts In the build-up multi-layer printed circuit boards of Examples 6–12 and Comparative Example 2, the peel strength of the electroless copper plated layer and the insulation resistance and glass transition point Tg of the adhesive layer are measured. Further, heat cycle test is carried out at −65° C.×30 min to 125° C.×30 min. The measured results are shown in Table 4. As seen from the results of this table, printed circuit boards having considerably improved adhesion strength, insulating property can be manufactured by using the adhesives according to the invention, which exhibit quasi-homogeneous compatible structure, co-continuous phase structure and spherical domain structure, as compared with the conventional ones.

TABLE 4

| | Peel strength (kg/cm) | Insulation resistance (Ω) | Tg (°C.) | Heat cycle property | Dielectric resistance |
|---|---|---|---|---|---|
| Example | | | | | |
| 6 | 2.2 | $10^{13}$ | 200 | >500 | 3.5 |
| 7 | 2.8 | $10^{13}$ | 210 | >1000 | 3.4 |
| 8 | 2.2 | $10^{13}$ | 190 | >500 | 3.4 |
| 9 | 1.9 | $10^{13}$ | 200 | >500 | 3.4 |
| 10 | 2.8 | $10^{13}$ | 220 | >1000 | 3.4 |
| 11 | 2.2 | $10^{13}$ | 200 | >500 | 3.5 |
| 12 | 1.9 | $10^{13}$ | 180 | >500 | 3.4 |
| Comparative Example | | | | | |
| 2 | 1.6 | $10^{11}$ | 160 | <400 | 4.0 |

Moreover, the evaluations on the peel strength, insulation resistance, glass transition temperature and heat cycle property are described below.

(1) Peel strength

It is measured according to JIS-C-6481.

(2) Insulation resistance

A resist pattern is formed by forming an interlaminar insulating layer on the substrate, roughening the surface of the resin layer, applying a catalyst thereto and forming a plated resin thereon. Thereafter, the electroless plating is conducted and an insulation resistance between patterns is measured. In this case, the value of insulation between comb-type patterns of L/S=75/75 μm is measured after 1000 hours at 80° C./85%/24V.

(3) Glass transition temperature Tg

It is measured by dynamic viscoelastic measurement.

(4) Heat cycle test

It is carried out at −65° C.×30 min to 125° C.×30 min, during which occurrence of cracks and peel of interlaminar insulating layer are measured. It is evaluated by durable cycle number.

EXAMPLE 13

Metallic Melamine Decorative Laminate

Although Examples 1–12 describe the printed circuit boards, the adhesive according to the invention is applied to a decorative laminate in this example.

(1) A melamine resin is impregnated in a paper-making sheet of woody pulp fibers having a basis weight of 10–80 g/m² and dried to form an impregnated paper having a thickness of 100 μm.

(2) The adhesive obtained in Example 1 is applied onto a surface of a plywood, which is dried at 30° C. under vacuum and cured by heating at 80° C. for 2 hours, at 120° C. for 5 hours and at 150° C. for 2 hours to form an adhesive layer having a thickness of 20 μm.

(3) This adhesive layer is immersed in an aqueous solution of chromic acid ($CrO_3$, 500 g/l) at 70° C. for 15 minutes to roughen the surface of the adhesive layer, which is immersed in a neutral solution (made by Shipley) and washed with water to an adhesive layer having Rmax=10±5 μm.

(4) A palladium catalyst (made by Shipley) is applied onto the substrate provided with the roughened adhesive layer to activate the surface of the adhesive layer, which is subjected to an electroless silver plating according to the usual manner to form a silver plated layer having a thickness of 60 μm.

(5) The melamine resin impregnated paper obtained in the above item (1) is laminated on the surface of the silver layer as an overlay paper.

(6) A shaping plate having unevenness of 1–60 μm is placed on the overlay paper and heat-pressed at 130°–170° C. under a pressure of 30–80 kg/cm² to provide a melamine decorative laminate having an embossed surface and a metallic gloss.

Since the melamine resin layer having a light transmissible and uneven surface is formed on the melamine decorative laminate, such an unevenness acts as a lens to floatably see the underground silver layer, whereby the silver gloss is attractive and the design becomes excellent.

Moreover, the cracking or peeling is not observed in the decorative laminate even after the heat cycle test of −65° C.×30 min to 125° C.×30 min.

As mentioned above, according to the invention, the resin composite comprised of thermosetting or photosensitive resin and thermoplastic resin and having a quasi-homogeneous compatible structure, co-continuous phase structure or a spherical domain structure is used as a heat-resistant resin matrix for an adhesive, whereby the resin matrix can be strengthened and the adhesion property between adhesive layer or interlaminar insulating layer and electroless plated layer can considerably be improved without lowering the heat resistance, electrical insulation and chemical stability.

Thus, printed circuit boards having excellent peel strength can stably be provided even in the wiring having high density and pattern accuracy.

Furthermore, the adhesive layer according to the invention is high in the peel strength, so that it can be applied to building materials such as decorative laminate and the like, various structural members and parts coated with a plated layer in addition to the printed circuit board.

What is claimed is:

1. An adhesive comprising:

an uncured heat-resistant resin matrix hardly soluble after curing in an oxidizing agent, said uncured heat-resistant resin matrix comprising a mixture of a thermoplastic resin and an uncured thermosetting resin; and heat-resistant resin particles soluble in said oxidizing agent dispersed in said uncured heat-resistant resin matrix.

2. The adhesive according to claim 1, wherein the heat-resistant resin matrix comprises a dispersion of a thermoplastic resin and an uncured thermosetting resin in a solvent.

3. The adhesive according to claim 1, wherein a part of functional groups in the thermosetting resin is substituted with a photosensitive group.

4. The adhesive according to claim 1, wherein said uncured thermosetting resin to said thermoplastic resin in said heat-resistant matrix comprises 15–50 wt % as a content of said thermoplastic resin.

5. The adhesive according to claim 1, comprising a viscosity of 0.5 to 10 Pa.s measured at 25° C.

6. The adhesive according to claim 1, wherein said thermosetting resin comprises an epoxy resin and said thermoplastic resin comprises polyether sulphone.

7. An adhesive comprising:

an uncured heat-resistant resin matrix hardly soluble after curing in an acid, said uncured heat-resistant resin matrix comprising a mixture of a thermoplastic resin and an uncured thermosetting resin; and heat-resistant resin particles soluble in said acid dispersed in said uncured heat-resistant resin matrix.

8. The adhesive according to claim 7, wherein the heat-resistant resin matrix comprises a dispersion of a thermoplastic resin and an uncured thermosetting resin in a solvent.

9. The adhesive according to claim 7, wherein a part of functional groups in the thermosetting resin is substituted with a photosensitive group.

10. The adhesive according to claim 7, wherein said uncured thermosetting resin to said thermoplastic resin in said heat-resistant matrix comprises 15–50 wt % as a content of said thermoplastic resin.

11. The adhesive according to claim 7, comprising a viscosity of 0.5 to 10 Pa.s measured at 25° C.

12. The adhesive according to claim 7, wherein said thermosetting resin comprises an epoxy resin and said thermoplastic resin comprises polyether sulphone.

13. An adhesive comprising:

an uncured heat-resistant resin matrix hardly soluble after curing in an oxidizing agent, said uncured heat-resistant resin matrix comprising a mixture of a thermoplastic resin and an uncured photosensitive resin; and heat-resistant resin particles soluble in said oxidizing agent dispersed in said uncured heat-resistant resin matrix.

14. The adhesive according to claim 13, wherein the heat-resistant resin matrix comprises a dispersion of thermoplastic resin and an uncured photosensitive resin in a solvent.

15. The adhesive according to claim 13, wherein said uncured photosensitive resin to said thermoplastic resin in said heat-resistant matrix comprises 15–50 wt % as a content of said thermoplastic resin.

16. The adhesive according to claim 13, comprising a viscosity of 0.5 to 10 Pa.s measured at 25° C.

17. An adhesive comprising:

an uncured heat-resistant resin matrix hardly soluble after curing in an acid, said uncured heat-resistant resin matrix comprising a mixture of a thermoplastic resin and an uncured photosensitive resin; and heat-resistant resin particles soluble in said acid dispersed in said uncured heat-resistant resin matrix.

18. The adhesive according to claim 17, wherein the heat-resistant resin matrix comprises a dispersion of thermoplastic resin and an uncured photosensitive resin in a solvent.

19. The adhesive according to claim 17, wherein said uncured photosensitive resin to said thermoplastic resin in said heat-resistant matrix comprises 15–50 wt % as a content of said thermoplastic resin.

20. The adhesive according to claim 17, comprising a viscosity of 0.5 to 10 Pa.s measured at 25° C.

21. An adhesive layer for electroless plating on a substrate, said adhesive layer produced by curing of an adhesive comprising an uncured heat-resistant resin matrix hardly soluble after curing in an oxidizing agent, said uncured heat-resistant resin matrix comprising a resin composite of a thermoplastic resin and a thermosetting resin; and heat-resistant resin particles soluble in said oxidizing agent dispersed in said uncured heat-resistant resin matrix.

22. The adhesive layer according to claim 21, wherein a part of functional groups in the thermosetting resin is substituted with a photosensitive group.

23. The adhesive layer according to claim 21, wherein the resin composite has a quasi-homogeneous compatible structure.

24. The adhesive layer according to claim 21, wherein the resin composite has a co-continuous phase structure.

25. The adhesive layer according to claim 21, wherein the resin composite has a spherical domain structure.

26. The adhesive layer according to claim 21, wherein said uncured thermosetting resin to said thermoplastic resin in said heat-resistant matrix comprises 15–50 wt % as a content of said thermoplastic resin.

27. The adhesive layer according to claim 21, wherein said thermosetting resin comprises an epoxy resin and said thermoplastic resin comprises polyether sulphone.

28. An adhesive layer for electroless plating on a substrate, said adhesive layer produced by curing of an adhesive comprising an uncured heat-resistant resin matrix hardly soluble after curing in an acid, said uncured heat-resistant resin matrix comprising a resin composite of a thermoplastic resin and a thermosetting resin; and heat-resistant resin particles soluble in said acid dispersed in said uncured heat-resistant resin matrix.

29. The adhesive layer according to claim 28, wherein a part of functional groups in the thermosetting resin is substituted with a photosensitive group.

30. The adhesive layer according to claim 28, wherein the resin composite has a quasi-homogeneous compatible structure.

31. The adhesive layer according to claim 28, wherein the resin composite has a co-continuous phase structure.

32. The adhesive layer according to claim 28, wherein the resin composite has a spherical domain structure.

33. The adhesive layer according to claim 28, wherein said uncured thermosetting resin to said thermoplastic resin in said heat-resistant matrix comprises 15–50 wt % as a content of said thermoplastic resin.

34. The adhesive layer according to claim 28, wherein said thermosetting resin comprises an epoxy resin and said thermoplastic resin comprises polyether sulphone.

35. An adhesive layer for electroless plating formed on a substrate, said adhesive layer produced by curing of an adhesive comprising an uncured heat-resistant resin matrix hardly soluble after curing in an oxidizing agent, said uncured heat-resistant resin matrix comprising a resin composite of a thermoplastic resin and a photosensitive resin; and heat-resistant resin particles soluble in said oxidizing agent dispersed in said uncured heat-resistant resin matrix.

36. The adhesive layer according to claim 35, wherein the resin composite has a quasi-homogeneous compatible structure.

37. The adhesive layer according to claim 35, wherein the resin composite has a co-continuous phase structure.

38. The adhesive layer according to claim 35, wherein the resin composite has a spherical domain structure.

39. The adhesive layer according to claim 35, wherein said uncured photosensitive resin to said thermoplastic resin in said heat-resistant matrix comprises 15–50 wt % as a content of said thermoplastic resin.

40. An adhesive layer for electroless plating formed on a substrate, said adhesive layer produced by curing of an adhesive comprising an uncured heat-resistant resin matrix hardly soluble after curing in an acid, said uncured heat-resistant resin matrix comprising a resin composite of a thermoplastic resin and a photosensitive resin; and heat-resistant resin particles soluble in said acid dispersed in said uncured heat-resistant resin matrix.

41. The adhesive layer according to claim 40, wherein the resin composite has a quasi-homogeneous compatible structure.

42. The adhesive layer according to claim 40, wherein the resin composite has a co-continuous phase structure.

43. The adhesive layer according to claim 40, wherein the resin composite has a spherical domain structure.

44. The adhesive layer according to claim 40, wherein said uncured photosensitive resin to said thermoplastic resin in said heat-resistant matrix comprises 15–50 wt % as a content of said thermoplastic resin.

45. A printed circuit board comprising:

a substrate;

an adhesive layer comprising a roughened surface formed on said substrate through curing of an adhesive comprising an uncured heat-resistant resin matrix hardly soluble after curing in an oxidizing agent, said uncured heat-resistant resin matrix comprising a resin composite of a thermoplastic resin and a thermosetting resin; and heat-resistant resin particles soluble in said oxidizing agent dispersed in said uncured heat-resistant resin matrix; and a conductor circuit on said roughened surface of said adhesive layer.

46. The printed circuit board according to claim 45, wherein a part of functional groups in the thermosetting resin is substituted with a photosensitive group.

47. The printed circuit board according to claim 45, wherein the resin composite has a quasi-homogeneous compatible structure.

48. The printed circuit board according to claim 45, wherein the resin composite has a co-continuous phase structure.

49. The printed circuit board according to claim 45, wherein the resin composite has a spherical domain structure.

50. The printed circuit board according to claim 45, wherein said uncured thermosetting resin to said thermoplastic resin in said heat-resistant matrix comprises 15–50 wt % as a content of said thermoplastic resin.

51. The printed circuit board according to claim 45, wherein said thermosetting resin comprises an epoxy resin and said thermoplastic resin comprises polyether sulphone.

52. A printed circuit board comprising:

a substrate;

an adhesive layer comprising a roughened surface formed on said substrate through curing of an adhesive comprising an uncured heat-resistant resin matrix hardly soluble after curing in an acid, said uncured heat-resistant resin matrix comprising a resin composite of a thermoplastic resin and a thermosetting resin; and heat-resistant resin particles soluble in said acid dispersed in said uncured heat-resistant resin matrix; and a conductor circuit on said roughened surface of said adhesive layer.

53. The printed circuit board according to claim 52, wherein a part of functional groups in the thermosetting resin is substituted with a photosensitive group.

54. The printed circuit board according to claim 52, wherein the resin composite has a quasi-homogeneous compatible structure.

55. The printed circuit board according to claim 52, wherein the resin composite has a co-continuous phase structure.

56. The printed circuit board according to claim 52, wherein the resin composite has a spherical domain structure.

57. The printed circuit board according to claim 52, wherein said uncured thermosetting resin to said thermoplastic resin in said heat-resistant matrix comprises 15–50 wt % as a content of said thermoplastic resin.

58. The printed circuit board according to claim 52, wherein said thermosetting resin comprises an epoxy resin and said thermoplastic resin comprises polyether sulphone.

59. A printed circuit board comprising:

a substrate;

an adhesive layer comprising a roughened surface formed on said substrate through curing of an adhesive comprising an uncured heat-resistant resin matrix hardly soluble after curing in an oxidizing agent, said uncured heat-resistant resin matrix comprising a resin composite of a thermoplastic resin and a photosensitive resin; and heat-resistant resin particles soluble in said oxidizing agent dispersed in said uncured heat-resistant resin matrix; and a conductor circuit on said roughened surface of said adhesive layer.

60. The printed circuit board according to claim 59, wherein the resin composite has a quasi-homogeneous compatible structure.

61. The printed circuit board according to claim 59, wherein the resin composite has a co-continuous phase structure.

62. The printed circuit board according to claim 59, wherein the resin composite has a spherical domain structure.

63. The printed circuit board according to claim 59, wherein said uncured photosensitive resin to said thermoplastic resin in said heat-resistant matrix comprises 15–50 wt % as a content of said thermoplastic resin.

64. A printed circuit board comprising:

a substrate;

an adhesive layer comprising a roughened surface formed on said substrate through curing of an adhesive comprising an uncured heat-resistant resin matrix hardly soluble after curing in an acid, said uncured heat-resistant resin matrix comprising a resin composite of a thermoplastic resin and a photosensitive resin; and heat-resistant resin particles soluble in said acid dispersed in said uncured heat-resistant resin matrix; and a conductor circuit on said roughened surface of said adhesive layer.

65. The printed circuit board according to claim 64, wherein the resin composite has a quasi-homogeneous compatible structure.

66. The printed circuit board according to claim 64, wherein the resin composite has a co-continuous phase structure.

67. The printed circuit board according to claim 64, wherein the resin composite has a spherical domain structure.

68. The printed circuit board according to claim 64, wherein said uncured photosensitive resin to said thermoplastic resin in said heat-resistant matrix comprises 15–50 wt % as a content of said thermoplastic resin.

\* \* \* \* \*